(12) United States Patent
Niimi et al.

(10) Patent No.: US 11,337,292 B1
(45) Date of Patent: May 17, 2022

(54) TIN TRAP DEVICE, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Gouta Niimi, Oyama (JP); Georg Soumagne, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/458,148

(22) Filed: Aug. 26, 2021

(30) Foreign Application Priority Data

Oct. 30, 2020 (JP) .............................. JP2020-182838

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *G03F 7/70058* (2013.01); *H05G 2/005* (2013.01); *H05G 2/008* (2013.01)

(58) Field of Classification Search
None
See application file for complete search history.

(56) References Cited

U.S. PATENT DOCUMENTS

| 8,572,988 | B2 | 11/2013 | Tanaka |
| 8,624,208 | B2 | 1/2014 | Nagai et al. |
| 8,872,142 | B2 | 10/2014 | Nagai et al. |
| 9,510,433 | B2 | 11/2016 | Nagai et al. |
| 10,162,277 | B2 | 12/2018 | Chien et al. |
| 10,314,152 | B2 | 6/2019 | Nagai et al. |
| 10,764,986 | B2 | 9/2020 | Nagai et al. |
| 2005/0122491 | A1* | 6/2005 | Bakker ............... G03F 7/70166 355/30 |
| 2017/0064800 | A1* | 3/2017 | Nagai ................... B23K 26/12 |

* cited by examiner

*Primary Examiner* — Michelle M Iacoletti
(74) *Attorney, Agent, or Firm* — Studebaker & Brackett PC

(57) ABSTRACT

A tin trap device may include a housing including a gas inlet port into which gas containing tin flows from a chamber device, an internal space which communicates with the gas inlet port, and a gas exhaust port which exhausts the gas while communicating with the internal space; a multiple tube including a plurality of tube members, arranged on a flow path of the gas traveling to the gas exhaust port from the gas inlet port through the internal space, and having a temperature at which the tin deposited from the gas adheres to the tube member; and a gas travel direction changing member configured to change a travel direction of at least fastest gas of the gas traveling from the gas inlet port to the multiple tube.

18 Claims, 11 Drawing Sheets

TIN TRAP DEVICE, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application claims the benefit of Japanese Patent Application No. 2020-182838, filed on Oct. 30, 2020, the entire contents of which are hereby incorporated by reference.

BACKGROUND

1. Technical Field

The present disclosure relates to a tin trap device, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: U.S. patent Ser. No. 10/162,277
Patent Document 2: U.S. Pat. No. 8,572,988
Patent Document 3: U.S. Pat. No. 8,624,208
Patent Document 4: U.S. Pat. No. 8,872,142
Patent Document 5: U.S. Pat. No. 9,510,433
Patent Document 6: U.S. patent Ser. No. 10/314,152
Patent Document 7: U.S. patent Ser. No. 10/764,986

SUMMARY

A tin trap device according to an aspect of the present disclosure includes a housing including a gas inlet port into which gas containing tin flows from a chamber device, an internal space which communicates with the gas inlet port, and a gas exhaust port which exhausts the gas while communicating with the internal space; a multiple tube including a plurality of tube members, arranged on a flow path of the gas traveling to the gas exhaust port from the gas inlet port through the internal space, and having a temperature at which the tin deposited from the gas adheres to the tube member; and a gas travel direction changing member configured to change a travel direction of at least fastest gas of the gas traveling from the gas inlet port to the multiple tube.

An extreme ultraviolet light generation apparatus according to an aspect of the present disclosure includes a chamber device configured to generate plasma by irradiation of a target substance including tin with laser light, and a tin trap device configured to collect the tin in the chamber device. Here, the tin trap device includes a housing including a gas inlet port into which gas containing tin flows from a chamber device; an internal space which communicates with the gas inlet port, and a gas exhaust port which exhausts the gas while communicating with the internal space; a multiple tube including a plurality of tube members, arranged on a flow path of the gas traveling to the gas exhaust port through the internal space from the gas inlet port, and having a temperature at which the tin deposited from the gas is to adhere to the tube member; and a gas travel direction changing member configured to change a travel direction of at least fastest gas of the gas traveling from the gas inlet port to the multiple tube.

An electronic device manufacturing method according to an aspect of the present disclosure includes generating plasma by irradiating a target substance with laser light using an extreme ultraviolet light generation apparatus, emitting the extreme ultraviolet light generated from the plasma to an exposure apparatus, and exposing a photosensitive substrate to the extreme ultraviolet light in the exposure apparatus to manufacture an electronic device. Here, the extreme ultraviolet light generation apparatus includes a chamber device configured to generate the plasma by irradiation of the target substance including tin with the laser light, and a tin trap device configured to collect the tin in the chamber device. The tin trap device includes a housing including a gas inlet port into which gas containing the tin flows from the chamber device, an internal space which communicates with the gas inlet port, and a gas exhaust port which exhausts the gas while communicating with the internal space; a multiple tube including a plurality of tube members, arranged on a flow path of the gas traveling to the gas exhaust port through the internal space from the gas inlet port, and having a temperature at which the tin deposited from the gas is to adhere to the tube member; and a gas travel direction changing member configured to change a travel direction of at least fastest gas of the gas traveling from the gas inlet port to the multiple tube.

An electronic device manufacturing method according to an aspect of the present disclosure includes generating plasma by irradiating a target substance with laser light using an extreme ultraviolet light generation apparatus, inspecting a defect of a mask by irradiating the mask with extreme ultraviolet light generated from the plasma, selecting a mask using a result of the inspection, and exposing and transferring a pattern formed on the selected mask onto a photosensitive substrate. Here, the extreme ultraviolet light generation apparatus includes a chamber device configured to generate the plasma by irradiation of the target substance including tin with the laser light, and a tin trap device configured to collect the tin in the chamber device. The tin trap device includes a housing including a gas inlet port into which gas containing tin flows from a chamber device, an internal space which communicates with the gas inlet port, and a gas exhaust port which exhausts the gas while communicating with the internal space; a multiple tube including a plurality of tube members, arranged on a flow path of the gas traveling to the gas exhaust port through the internal space from the gas inlet port, and having a temperature at which the tin deposited from the gas is to adhere to the tube member; and a gas travel direction changing member configured to change a travel direction of at least fastest gas of the gas traveling from the gas inlet port to the multiple tube.

BRIEF DESCRIPTION OF THE DRAWINGS

Embodiments of the present disclosure will be described below merely as examples with reference to the accompanying drawings.

DESCRIPTION OF EMBODIMENTS

Figure 1:
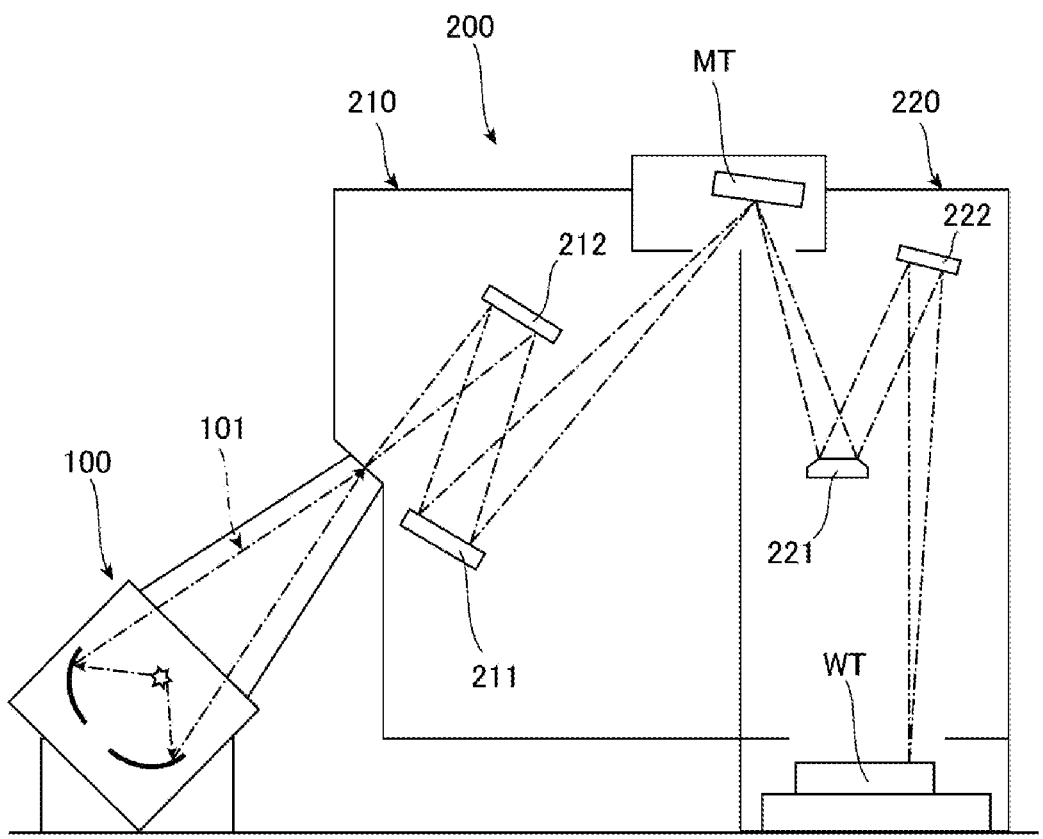
FIG. 1 is a schematic view showing a schematic configuration example of an entire electronic device manufacturing apparatus.

1. Overview
2. Description of electronic device manufacturing apparatus
3. Description of extreme ultraviolet light generation apparatus of comparative example
   3.1 Configuration
   3.2 Operation
   3.3 Problem
4. Description of tin trap device of first embodiment
   4.1 Configuration
   4.2 Operation
   4.3 Effect
5. Description of tin trap device of second embodiment
   5.1 Configuration
   5.2 Effect
6. Description of tin trap device of third embodiment
   6.1 Configuration
   6.2 Effect Hereinafter, embodiments of the present disclosure will be described in detail with reference to the drawings.

The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. OVERVIEW

Embodiments of the present disclosure relate to an extreme ultraviolet light generation apparatus generating light having a wavelength of extreme ultraviolet (EUV) and an electronic device manufacturing apparatus. In the following, extreme ultraviolet light is referred to as EUV light in some cases.

2. DESCRIPTION OF ELECTRONIC DEVICE MANUFACTURING APPARATUS

FIG. 1 is a schematic view showing a schematic configuration example of an entire electronic device manufacturing apparatus. The electronic device manufacturing apparatus shown in FIG. 1 includes an EUV light generation apparatus 100 and an exposure apparatus 200. The exposure apparatus 200 includes a mask irradiation unit 210 including a plurality of mirrors 211, 212 that constitute a reflection optical system, and a workpiece irradiation unit 220 including a plurality of mirrors 221, 222 that constitute a reflection optical system different from the reflection optical system of the mask irradiation unit 210. The mask irradiation unit 210 illuminates, via the mirrors 211, 212, a mask pattern of the mask table MT with EUV light 101 incident from the EUV light generation apparatus 100. The workpiece irradiation unit 220 images the EUV light 101 reflected by the mask table MT onto a workpiece (not shown) arranged on the workpiece table WT via the mirrors 211, 212. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
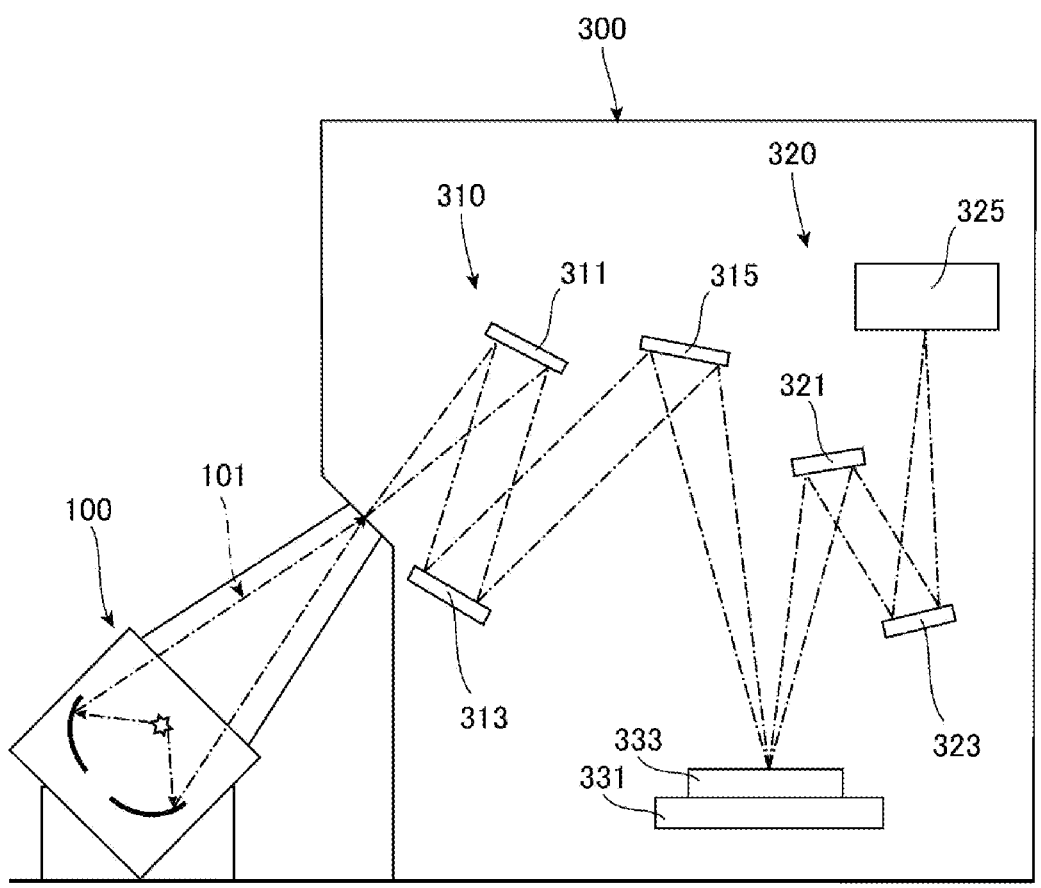
FIG. 2 is a schematic view showing a schematic configuration example of an entire electronic device manufacturing apparatus different from the electronic device manufacturing apparatus shown in FIG. 1.

FIG. 2 is a schematic view showing a schematic configuration example of an entire electronic device manufacturing apparatus different from the electronic device manufacturing apparatus shown in FIG. 1. The electronic device manufacturing apparatus shown in FIG. 2 includes the EUV light generation apparatus 100 and an inspection apparatus 300. The inspection apparatus 300 includes an illumination optical system 310 including a plurality of mirrors 311, 313, 315 that constitute a reflection optical system, and a detection optical system 320 including a plurality of mirrors 321, 322 that constitute a reflection optical system different from the reflection optical system of the illumination optical system 310 and a detector 325. The illumination optical system 310 reflects, with the mirrors 311, 313, 315, the EUV light 101 incident from the EUV light generation apparatus 100 to illuminate a mask 333 placed on a mask stage 331. The mask 333 includes a mask blank before a pattern is formed. The detection optical system 320 reflects, with the mirrors 321, 323, the EUV light 101 reflecting the pattern from the mask 333 and forms an image on a light receiving surface of the detector 325. The detector 325 having received the EUV light 101 obtains an image of the mask 333. The detector 325 is, for example, a time delay integration (TDI) camera. A defect of the mask 333 is inspected based on the image of the mask 333 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 200.

3. DESCRIPTION OF EXTREME ULTRAVIOLET LIGHT GENERATION APPARATUS OF COMPARATIVE EXAMPLE

3.1 Configuration

The EUV light generation apparatus 100 of a comparative example will be described. The comparative example of the present disclosure is an example recognized by the applicant as known only by the applicant, and is not a publicly known example admitted by the applicant. Further, the following description will be given with reference to the EUV light generation apparatus 100 that emits the EUV light 101 toward the exposure apparatus 200 as an external apparatus as shown in FIG. 1. Here, the EUV light generation apparatus 100 that emits the EUV light 101 to the inspection apparatus 300 as an external apparatus as shown in FIG. 2 can obtain the same operation and effect as the EUV light generation apparatus 100 that emits the EUV light 101 toward the exposure apparatus 200.

Figure 3:
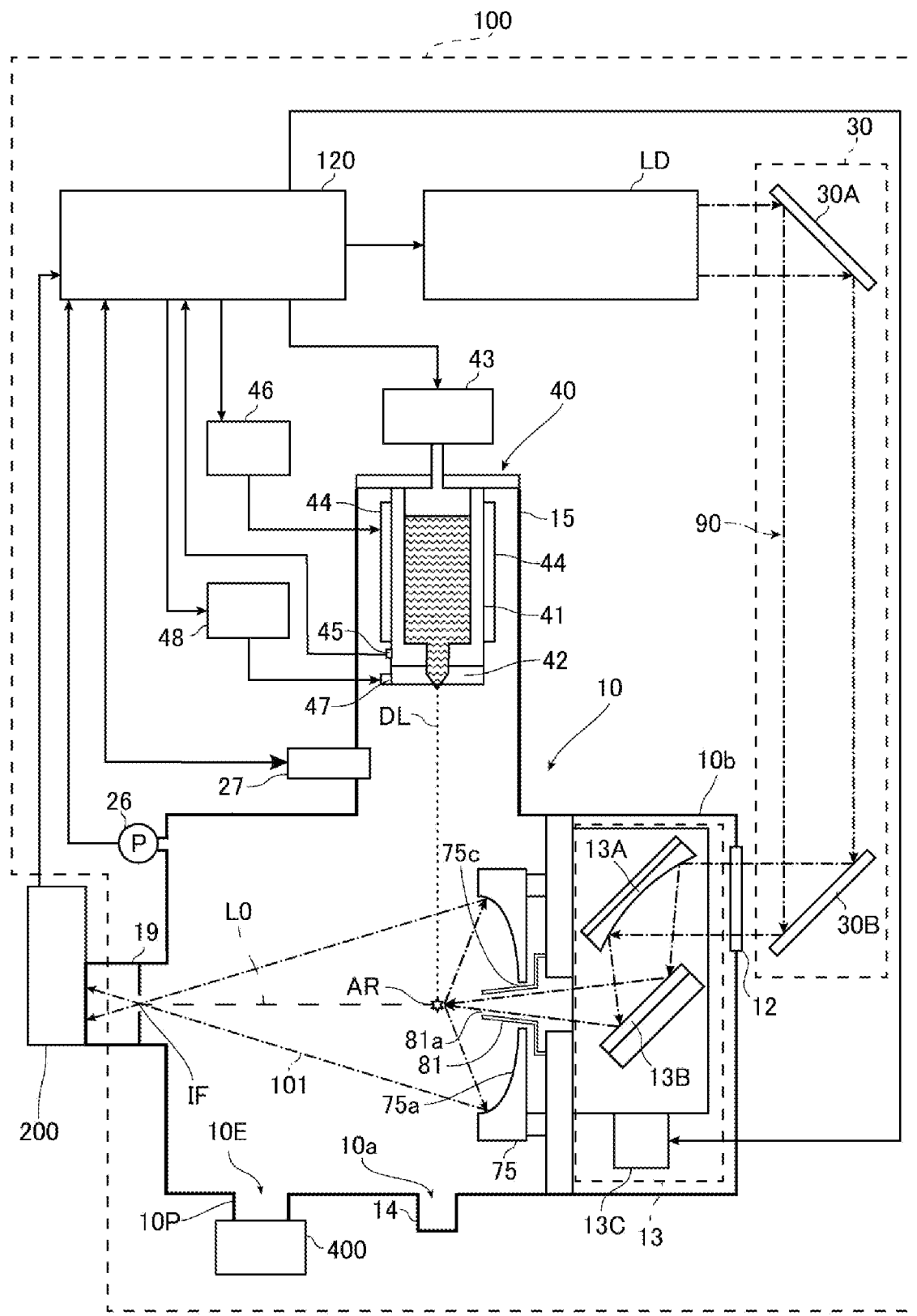
FIG. 3 is a schematic view showing a schematic configuration example of an entire EUV light generation apparatus.

FIG. 3 is a schematic view showing a schematic configuration example of the entire EUV light generation apparatus 100 of the present example. As shown in FIG. 3, the EUV light generation apparatus 100 includes a laser device LD, a chamber device 10, a processor 120, and a laser light delivery optical system 30 as a main configuration.

The chamber device 10 is a sealable container. The chamber device 10 includes an inner wall 10b surrounding an internal space having a low pressure atmosphere. The chamber device 10 includes a sub-chamber 15 and a target supply device 40 is arranged in the sub-chamber 15. The target supply device 40 is attached to penetrate through a wall of the sub-chamber 15. The target supply device 40 includes a tank 41 and a nozzle 42, and supplies droplets DL to the internal space of the chamber device 10. The droplet DL is also referred to as a target.

The tank 41 stores therein a target substance which becomes the droplet DL. The target substance contains tin. The inside of the tank 41 communicates, through a pipe, with a pressure adjuster 43 which adjusts gas pressure. A heater 44 and a temperature sensor 45 are attached to the tank 41. The heater 44 heats the tank 41 with current applied from a heater power source 46. Through the heating, the target substance in the tank 41 melts. The temperature sensor 45 measures, through the tank 41, the temperature of the target substance in the tank 41. The pressure adjuster 43, the temperature sensor 45, and the heater power source 46 are electrically connected to the processor 120.

The nozzle 42 is attached to the tank 41 and outputs the target substance. A piezoelectric element 47 is attached to the nozzle 42. The piezoelectric element 47 is electrically connected to a piezoelectric power source 48 and is driven by voltage applied from the piezoelectric power source 48. The piezoelectric power source 48 is electrically connected to the processor 120. The target substance output from the nozzle 42 is formed into the droplet DL through operation of the piezoelectric element 47.

The chamber device 10 also includes a target collection unit 14. The target collection unit 14 is a box body attached to the inner wall 10b of the chamber device 10. The target collection unit 14 communicates with the internal space of the chamber device 10 through an opening 10a continued to the inner wall 10b of the chamber device 10. The target collection unit 14 and the opening 10a are disposed directly below the nozzle 42. The target collection unit 14 is a drain tank to collect any unnecessary droplet DL passing through the opening 10a and reaching the target collection unit 14 and to accumulate the unnecessary droplet DL.

At least one through hole is formed in the inner wall 10b of the chamber device 10. The through hole is blocked by a window 12 through which pulse laser light 90 emitted from the laser device LD passes.

Further, a laser light concentrating optical system 13 is arranged in the internal space of the chamber device 10. The laser light concentrating optical system 13 includes a laser light concentrating mirror 13A and a high reflection mirror 13B. The laser light concentrating mirror 13A reflects and concentrates the laser light 90 passing through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a concentrating position of the laser light 90 at the internal space of the chamber device 10 coincides with a position specified by the processor 120. The concentrating position is adjusted to be positioned directly below the nozzle 42, and when the target substance constituting the droplet DL is irradiated with the laser light 90 at the concentrating position, plasma is generated by the irradiation, and the EUV light 101 is radiated from the plasma. In the following, the region in which plasma is generated is sometimes referred to as a plasma generation region AR.

For example, an EUV light concentrating mirror 75 having a spheroidal reflection surface 75a is arranged at the internal space of the chamber device 10. The reflection surface 75a reflects the EUV light 101 radiated from the plasma in the plasma generation region AR. The reflection surface 75a has a first focal point and a second focal point. The reflection surface 75a may be disposed such that, for example, the first focal point is located in the plasma generation region AR and the second focal point is located at an intermediate focal point IF. In FIG. 3, a straight line passing through the first focal point and the second focal point is shown as a focal line L0.

Further, the EUV light generation apparatus 100 includes a connection portion 19 providing communication between the internal space of the chamber device 10 and an internal space of the exposure apparatus 200. A wall in which an aperture is formed is arranged inside the connection portion 19. The wall is preferably arranged such that the aperture is located at the second focal point. The connection portion 19 is an emission port of the EUV light 101 in the EUV light generation apparatus 100, and the EUV light 101 is emitted from the connection portion 19 and enters the exposure apparatus 200.

Further, the EUV light generation apparatus 100 includes a pressure sensor 26 and a target sensor 27. The pressure sensor 26 and the target sensor 27 are attached to the chamber device 10 and are electrically connected to the processor 120. The pressure sensor 26 measures pressure in the internal space of the chamber device 10. The target sensor 27 has, for example, an imaging function, and detects the presence, trajectory, position, velocity, and the like of the droplet DL according to an instruction from the processor 120.

The laser device LD includes a master oscillator being a light source to perform burst operation. The master oscillator emits the pulse laser light 90 in a burst-on duration. The master oscillator is, for example, a laser device configured to emit the laser light 90 by exciting, through electric discharge, gas as mixture of carbon dioxide gas with helium, nitrogen, or the like. Alternatively, the master oscillator may be a quantum cascade laser device. The master oscillator may emit the pulse laser light 90 by a Q switch system. Further, the master oscillator may include an optical switch, a polarizer, and the like. In the burst operation, the pulse laser light 90 is continuously emitted at a predetermined repetition frequency in the burst-on duration and the emission of the laser light 90 is stopped in a burst-off duration.

A travel direction of the laser light 90 emitted from the laser device LD is adjusted by the laser light delivery optical system 30. The laser light delivery optical system 30 includes a plurality of mirrors 30A and 30B for adjusting the travel direction of the laser light 90. The position of at least one of the mirrors 30A, 30B is adjusted by an actuator (not shown). Owing to that the position of at least one of the mirrors 30A, 30B is adjusted, the laser light 90 can appropriately propagate to the internal space of the chamber device 10 through the window 12.

The processor 120 of the present disclosure is a processing device including a storage device in which a control program is stored and a CPU which executes the control program. The processor 120 is specifically configured or programmed to perform various processes included in the present disclosure. The processor 120 controls several configurations of the EUV light generation apparatus 100. Further, the processor 120 controls the entire EUV light generation apparatus 100. The processor 120 receives a signal related to the pressure in the internal space of the chamber device 10, which is measured by the pressure sensor 26, a signal related to image data of the droplet DL captured by the target sensor 27, a burst signal from the exposure apparatus 200, and the like. The processor 120 processes the image data and the like, and may control, for example, timing at which the droplet DL is output, an output direction of the droplet DL, and the like. Further, the processor 120 may control oscillation timing of the laser device LD, the travel direction of the laser light 90, the concentrating position of the laser light 90, and the like. Such various kinds of control described above are merely exemplary, and other control may be added as necessary, as described later.

A central gas supply unit 81 for supplying etching gas to the internal space of the chamber device 10 is arranged at the chamber device 10. As described above, since the target substance contains tin, the etching gas is, for example, hydrogen-containing gas having a hydrogen gas concentration of 100% in effect. Alternatively, the etching gas may be, for example, balance gas having a hydrogen gas concentration of about 3%. The balance gas contains nitrogen ($N_2$) gas and argon (Ar) gas. Tin fine particles and tin charged particles are generated when the target substance constituting the droplet DL is turned into plasma in the plasma generation region AR by being irradiated with the laser light 90. Tin constituting these fine particles and charged particles reacts with hydrogen contained in the etching gas supplied to the internal space of the chamber device 10. Through the reaction with hydrogen, tin becomes stannane ($SnH_4$) gas at room temperature.

The central gas supply unit 81 has a shape of a side surface of a circular truncated cone and is called a cone in some cases. The central gas supply unit 81 is inserted through a through hole 75c formed in the center of the EUV light concentrating mirror 75.

The central gas supply unit 81 has a central gas supply port 81a being a nozzle. The central gas supply port 81a is provided on the focal line L0 passing through the first focal point and the second focal point of the reflection surface 75a. The focal line L0 is extended along the center axis direction of the reflection surface 75a.

The central gas supply port 81a supplies the etching gas from the center side of the reflection surface 75a toward the plasma generation region AR. The central gas supply port 81a preferably supplies the etching gas in the direction away from the reflection surface 75a from the center side of the reflection surface 75a along the focal line L0. The central gas supply port 81a is connected to a gas supply device (not shown) being a tank through a pipe (not shown) of the central gas supply unit 81 and the etching gas is supplied therefrom. The gas supply device is driven and controlled by the processor 120. A supply gas flow rate adjusting unit (not shown) may be arranged in the pipe (not shown).

The central gas supply port 81a is a gas supply port for supplying the etching gas to the internal space of the chamber device 10 as well as an emission port through which the laser light 90 is emitted to the internal space of the chamber device 10. The laser light 90 travels toward the internal space of the chamber device 10 through the window 12 and the central gas supply port 81a.

An exhaust port 10E is continued to the inner wall 10b of the chamber device 10. Since the exposure apparatus 200 is disposed on the focal line L0, the exhaust port 10E is disposed not on the focal line L0 but on the inner wall 10b on the side lateral to the focal line L0. The direction along the center axis of the exhaust port 10E is perpendicular to the focal line L0. The exhaust port 10E is provided on the side opposite to the reflection surface 75a with respect to the plasma generation region AR when viewed from the direction perpendicular to the focal line L0. The exhaust port 10E exhausts residual gas to be described later in the internal space of the chamber device 10. The exhaust port 10E is connected to an exhaust pipe 10P, and the exhaust pipe 10P is connected to a tin trap device 400.

As described above, when the target substance is turned into plasma in the plasma generation region AR, the residual gas as exhaust gas is generated in the internal space of the chamber device 10. The residual gas contains tin fine particles and tin charged particles generated through the plasma generation from the target substance, stannane generated through the reaction of the tin fine particles and tin charged particles with the etching gas, and unreacted etching gas. Some of the charged particles are neutralized in the internal space of the chamber device 10, and the residual gas contains the neutralized charged particles as well. The residual gas flows into the tin trap device 400 through the exhaust port 10E and the exhaust pipe 10P.

Next, the configuration of the tin trap device 400 will be described in more detail.

Figure 4:
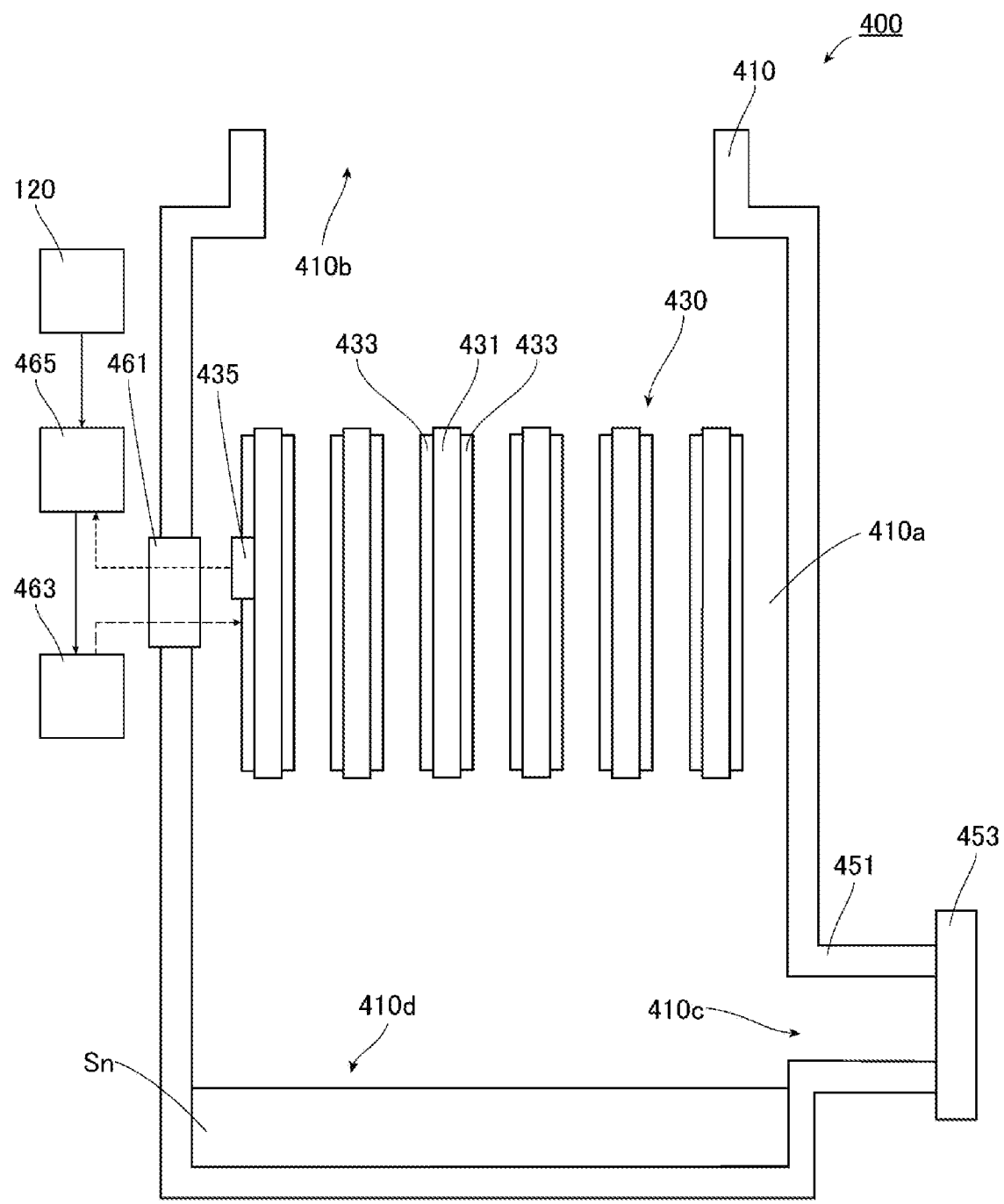
FIG. 4 is a schematic view showing a schematic configuration example of a part including a tin trap device according to a comparative example.

FIG. 4 is a schematic view showing a schematic configuration example of the tin trap device 400 according to a comparative example. As shown in FIG. 4, the tin trap device 400 includes a housing 410 and a trap main body 430 arranged at an internal space 410a of the housing 410 as main components.

The housing 410 has a shape, the longitudinal direction of which extends in the vertical direction. The housing 410 includes a gas inlet port 410b arranged at a part of a top wall of the housing 410 and connected to the exhaust pipe 10P, and a gas exhaust port 410c arranged at a part of a side wall of the housing 410 extending along the vertical direction. The gas inlet port 410b and the gas exhaust port 410c communicate with the internal space 410a.

The residual gas flows into the gas inlet port 410b from the chamber device 10 through the exhaust pipe 10P.

The gas exhaust port 410c is arranged on the opposite side to the gas inlet port 410b side with respect to the trap main body 430 and is arranged on the trap main body 430 side with respect to a bottom wall of the housing 410, and exhausts the residual gas to the outside of the housing 410. The gas exhaust port 410c is connected to an exhaust pipe 451, and the exhaust pipe 451 extends substantially horizontally and is connected to an exhaust pump 453.

In the tin trap device 400 of the comparative example, the residual gas flows from the internal space of the chamber device 10 to the internal space 410a of the housing 410 through the exhaust pipe 10p and the gas inlet port 410b. In addition, the residual gas flows toward the bottom wall side of the housing 410 along the vertical direction in the internal space 410a of the housing 410, is bent to the horizontal direction from the vertical direction by suction of the exhaust pump 453, and flows toward the gas exhaust port 410c. Finally, the residual gas is sucked into the exhaust pump 453 through the exhaust pipe 451 from the gas exhaust port 410c. In the above configuration, the flow path of the residual gas flowing from the gas inlet port 410b toward the exhaust pump 453 is bent in an L-shape.

The bottom wall of the housing 410 is located below the gas exhaust port 410c as described above, and the portion below the gas exhaust port 410c is a drain tank 410d in which tin is accumulated.

The trap main body 430 is arranged in a portion along the vertical direction in the flow path in the housing 410, and is arranged between the gas inlet port 410b and the gas exhaust port 410c in the flow path. Therefore, the trap main body 430 is arranged on the flow path of the residual gas traveling from the gas inlet port 410b to the gas exhaust port 410c through the internal space 410a.

The trap main body 430 includes a plurality of plate-like members 431 and a heater 433 which is a heating element arranged on each of the plate-like members 431. In FIG. 4, for ease of viewing, only one plate-like member 431 and two heaters 433 are denoted by reference numerals, and reference numerals of other plate-like members 431 and reference numerals of other heaters 433 are omitted.

The plate-like members 431 are arranged side by side in the horizontal direction at predetermined intervals in a state in which main surfaces of each of the plate-like member 431 being the front surface and the back surface thereof are arranged along the vertical direction. Therefore, the main surface of a certain plate-like member 431 among the plurality of plate-like members 431 faces a main surface of a plate-like member 431 adjacent to the certain plate-like member 431. The shape of the main surface is generally rectangular.

The heater 433 is arranged on the main surface of each plate-like member 431. Further, the heater 433 is arranged along the vertical direction on each main surface. When one main surface of the plate-like member 431 is viewed from the front, the length of the heater 433 is shorter than the length of the main surface, the width of the heater 433 is smaller than the width of the main surface, and the main surface is exposed from the heater 433. Further, when the plate-like members 431 and the heaters 433 are viewed from the gas inlet port 410b side along the travel direction of the residual gas, a gap can be seen between the plate-like members 431 where the heater 433 is arranged. Therefore, the exposed portion of the main surface comes into contact with the residual gas flowing from the gas inlet port 410b toward the gas exhaust port 410c. Here, the length and the width of the plate-like member 431 and the length and the width of the heater 433 are not particularly limited as long as the main surface is exposed from the heater 433 and the residual gas is in contact with the exposed portion.

The plate-like member 431 and the heater 433 as described above form a wall portion that partitions the flow path into a plurality of sections. The arrangement of the plate-like member 431 and the heater 433 is not particularly limited as long as the flow path can be divided into a plurality of sections. For example, the plate-like member 431 may be arranged in a lattice shape, and one heater 433 may be arranged on the plate-like member 431.

The heater 433 is electrically connected to a heater power source 463 arranged outside the housing 410 through a feedthrough 461 arranged at the housing 410. The heater power source 463 applies current to the heater 433. The heater 433 generates heat with the current applied from the heater power source 463. In FIG. 4, for ease of viewing, only the electrical connection between one heater 433 and the heater power source 463 is indicated by a dashed arrow.

Further, a temperature sensor 435 for detecting the temperature of the plate-like member 431 is arranged on the plate-like member 431. Although FIG. 4 shows an example in which the temperature sensor 435 is arranged on one plate-like member 431, the temperature sensor 435 may be arranged on each plate-like member 431. The temperature sensor 435 is electrically connected to a temperature controller 465 arranged outside the housing 410 through the feedthrough 461. The temperature controller 465 is also electrically connected to the processor 120 and the heater power source 463. A signal from the processor 120 and a signal from the temperature sensor 435 are input to the temperature controller 465. The temperature controller 465 adjusts the current applied to the heater 433 by the heater power source 463 based on these signals.

The heater 433 heats the plate-like member 431 to a temperature equal to or higher than the melting point of tin and lower than the boiling point thereof, for example, with the adjusted current. That is, the temperature of the plate-like member 431 becomes equal to 231.93° C. or higher and lower than 2602° C.

3.2 Operation

Next, operation of the EUV light generation apparatus 100 of the comparative example will be described. In the EUV light generation apparatus 100, for example, at the time of new installation or maintenance or the like, atmospheric air in the internal space of the chamber device 10 is exhausted. At this time, purging and exhausting of the internal space of the chamber device 10 may be repeated for exhausting atmospheric components. For example, inert gas such as nitrogen or argon is preferably used for the purge gas. Thereafter, when the pressure in the internal space of the chamber device 10 becomes equal to or lower than a predetermined pressure, the processor 120 starts introduction of the etching gas from the gas supply device to the internal space of the chamber device 10 through the central gas supply unit 81. At this time, the processor 120 may control a supply gas flow rate adjusting unit (not shown) and the exhaust pump 453 so that the pressure in the internal space of the chamber device 10 is maintained at a predetermined pressure. Thereafter, the processor 120 waits until a predetermined time elapses from the start of introduction of the etching gas.

Further, the processor 120 causes the gas in the internal space of the chamber device 10 to be exhausted from the exhaust port 10E by the exhaust pump 453, and keeps the pressure in the internal space of the chamber device 10 substantially constant based on the signal of the pressure in the internal space of the chamber device 10 measured by the pressure sensor 26.

In order to heat and maintain the target substance in the tank 41 at a predetermined temperature equal to or higher than the melting point, the processor 120 causes the heater power source 46 to apply current to the heater 44 to increase temperature of the heater 44. In this case, the processor 120 controls the temperature of the target substance to the predetermined temperature by adjusting a value of the current applied from the heater power source 46 to the heater 44 based on an output from the temperature sensor 45. When the target substance is tin, the predetermined temperature is equal to or higher than 231.93° C. being the melting point of tin and, for example, is 240° C. or higher and 290° C. or lower.

Further, the processor 120 causes the pressure adjuster 43 to adjust the pressure in the tank 41 so that the melted target substance is output through the nozzle hole of the nozzle 42 at a predetermined flow velocity. Under this pressure, the target substance is output through the nozzle hole of the nozzle 42. The target substance output through the nozzle hole may be in the form of jet. At this time, the processor 120 causes the piezoelectric power source 48 to apply voltage having a predetermined waveform to the piezoelectric element 47 to generate the droplet DL. Vibration of the piezoelectric element 47 can propagate through the nozzle 42 to the target substance to be output through the nozzle hole of the nozzle 42. The target substance is divided at a predetermined cycle by the vibration to be liquid droplets DL.

The target sensor 27 detects passage timing of the droplet DL passing through a predetermined position in the chamber device 10. The processor 120 outputs, to the laser device LD, a light emission trigger signal synchronized with a signal from the target sensor 27. When the light emission trigger signal is input, the laser device LD emits the pulse laser light 90. The emitted laser light 90 is incident on the laser light concentrating optical system 13 through the laser light delivery optical system 30 and the window 12. Further, the laser light 90 travels from the laser light concentrating optical system 13 to the central gas supply unit 81 which is an emission portion. The laser light 90 is emitted along the focal line L0 toward the plasma generation region AR from the central gas supply port 81a, which is the emission port of the central gas supply unit 81, and is radiated to the droplet DL in the plasma generation region AR. At this time, the processor 120 controls the laser light manipulator 13C of the laser light concentrating optical system 13 such that the laser light 90 is concentrated in the plasma generation region AR. The processor 120 controls the timing of emitting the laser light 90 from the laser device LD based on the signal from the target sensor 27 so that the droplet DL is irradiated with the laser light 90. Thus, the droplet DL is irradiated in the plasma generation region AR with the laser light 90 concentrated by the laser light concentrating mirror 13A. Light including EUV light is emitted from the plasma generated through the irradiation.

Among the light including the EUV light generated in the plasma generation region AR, the EUV light 101 is concentrated at the intermediate focal point IF by the EUV light concentrating mirror 75, and then is incident on the exposure apparatus 200 from the connection portion 19.

When the target substance is turned into plasma, tin fine particles are generated as described above. The fine particles diffuse into the internal space of the chamber device 10. The fine particles diffusing into the internal space of the chamber device 10 react with the hydrogen-containing etching gas supplied from the central gas supply unit 81 to become stannane. Most of the stannane obtained through the reaction with the etching gas flows into the exhaust port 10E along with the flow of the unreacted etching gas. At least some of the unreacted charged particles, fine particles, and etching gas flow into the exhaust port 10E.

The unreacted etching gas, fine particles, charged particles, stannane, and the like having flowed into the exhaust port 10E flow as the residual gas from the exhaust pipe 10p to the internal space 410a of the housing 410 through the gas inlet port 410b of the housing 410 in the tin trap device 400. The residual gas flowing to the internal space 410a of the housing 410 passes through the gap between the plate-like members 431 and flows toward the bottom wall of the housing 410. In this manner, the residual gas travels along the vertical direction from the gas inlet port 410b toward the bottom wall of the housing 410.

Here, the plate-like member 431 is heated by the heater 433 to a temperature equal to or higher than 231.93° C. and lower than 2602° C. as described above. In the case where the residual gas passes through the gap between the plate-like members 431 heated in this manner, when the residual gas comes into contact with the main surface of the plate-like member 431, tin is deposited from the residual gas. More specifically, decomposition of the stannane is accelerated when the temperature of the plate-like member 431 is 40° C. or higher, as compared with the case where the temperature is 40° C. or lower. Therefore, some of stannane contained in the residual gas returns to tin by heating, and tin adheres to the plate-like member 431 in a liquid state. In addition, some of the tin charged particles and tin fine particles contained in the residual gas also adhere to the plate-like member 431 in a liquid state. Tin adhering to the plate-like member 431 falls from the plate-like member 431 by gravity and is collected in the drain tank 410d.

When the residual gas passes through the gap between the plate-like members 431 as described above, hydrogen is generated from stannane by the heat from the plate-like members 431. Hydrogen flows toward the bottom wall of the housing 410 together with the residual gas from which most of tin has been removed, is bent toward the gas exhaust port 410c by suction of the exhaust pump 453, and is sucked into the exhaust pump 453 through the exhaust pipe 451 from the gas exhaust port 410c.

3.3 Problem

The plate-like members 431 of the tin trap device 400 of the comparative example are arranged side by side in the horizontal direction at predetermined intervals in a state of being erected in the vertical direction. Therefore, in the tin trap device 400 of the comparative example, the residual gas having a higher flow velocity may pass through the gap between the plate-like members 431 in a state of containing a larger amount of tin and flow into the exhaust pump 453 before tin in a liquid state is deposited from the residual gas. When the residual gas containing tin flows into the exhaust pump 453, the adhered amount of tin in the exhaust pump 453 may increase. There is a concern that increase of the adhered amount of tin will reduce the exhaust capacity of the exhaust pump 453 for the residual gas in the chamber device 10, and reduce the reliability of the EUV light generation apparatus 100.

Therefore, the following embodiments exemplify a tin trap device 400 capable of suppressing decrease in the reliability of the EUV light generation apparatus 100.

4. DESCRIPTION OF TIN TRAP DEVICE OF FIRST EMBODIMENT

Next, the configuration of the tin trap device 400 according to a first embodiment will be described. Any component same as that described above is denoted by an identical reference sign, and duplicate description thereof is omitted unless specific description is needed.

4.1 Configuration

Figure 5:
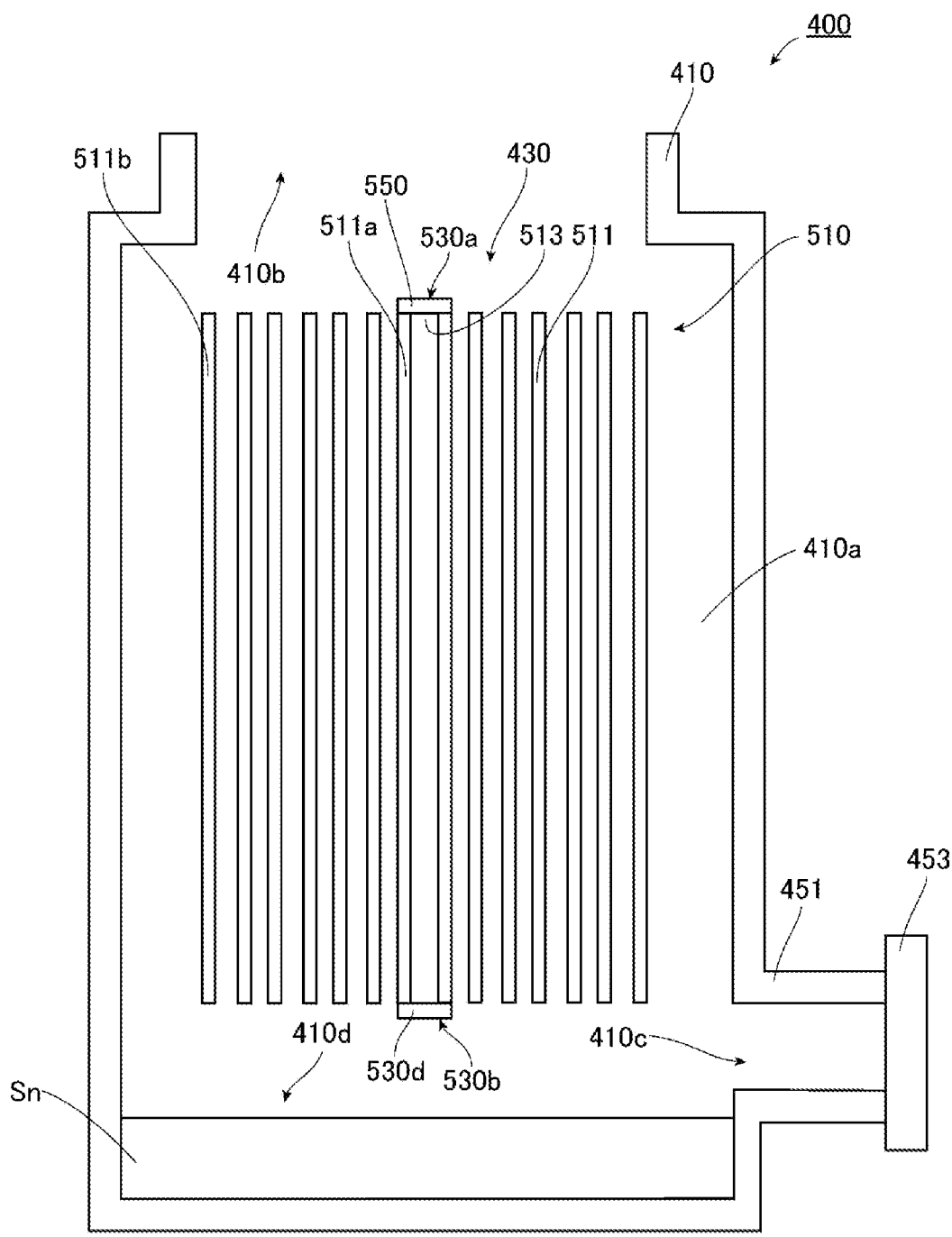
FIG. 5 is a schematic view showing a schematic configuration example of a part including the tin trap device according to a first embodiment.
Figure 6:
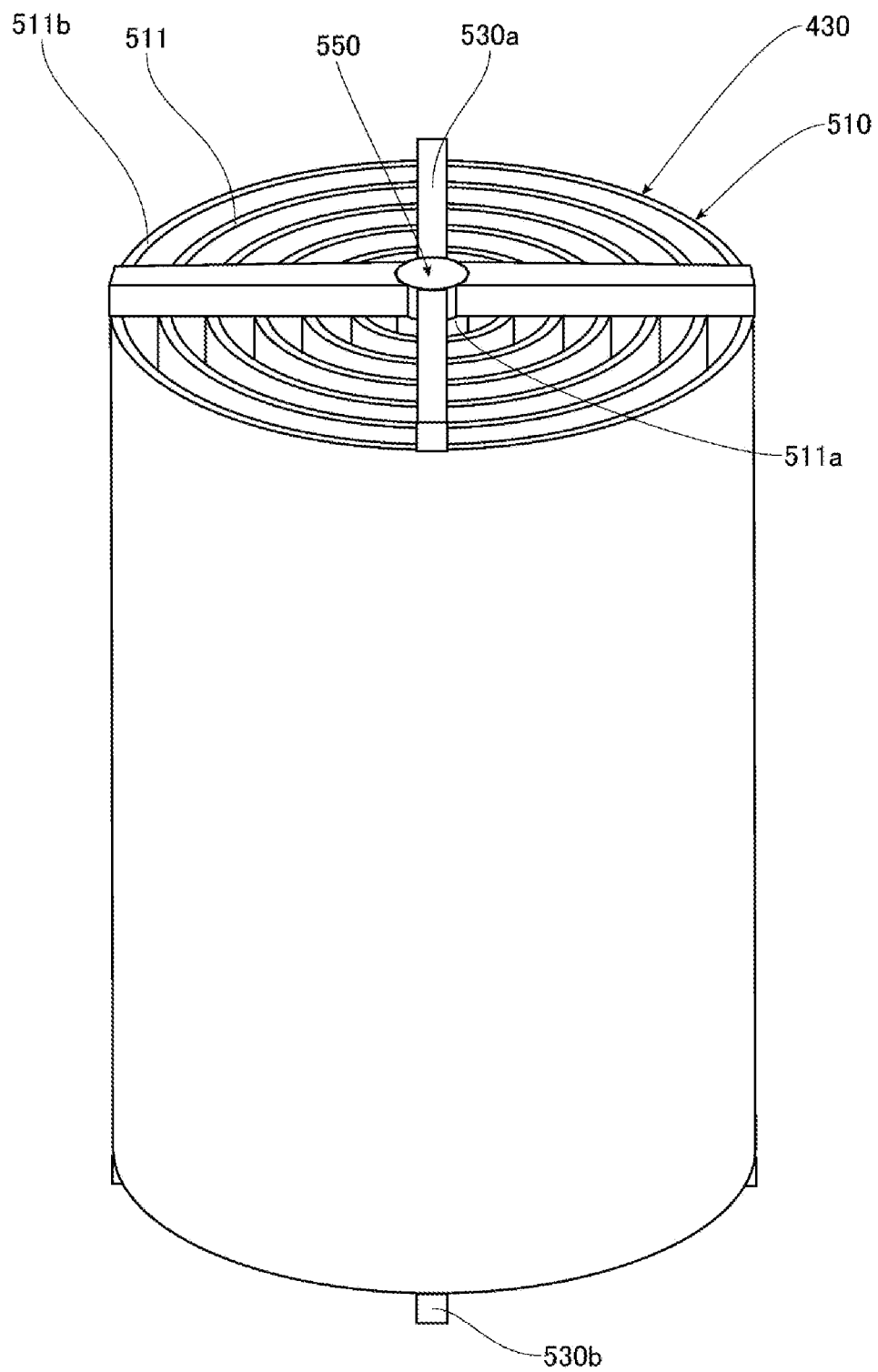
FIG. 6 is a perspective view of a multiple tube of a trap main body in the tin trap device.

FIG. 5 is a schematic view showing a schematic configuration example of a part including the tin trap device 400 according to the present embodiment. FIG. 6 is a perspective view of a multiple tube 510 of the trap main body 430 in the tin trap device 400 according to the present embodiment.

In the tin trap device 400 of the present embodiment, unlike the tin trap device 400 of the comparative example, the temperature sensor 435, the feedthrough 461, the heater power source 463, and the temperature controller 465 are not arranged.

In addition, in the tin trap device 400 of the present embodiment, the configuration of the trap main body 430 is different from the configuration of the trap main body 430 of the comparative example, and the trap main body 430 of the present embodiment includes the multiple tube 510, a pair of fixing members 530a, 530b arranged in the multiple tube 510, and a gas travel direction changing member 550 arranged in the multiple tube 510.

The multiple tube 510 includes a plurality of tube members 511 arranged concentrically, and each tube member 511 extends along the vertical direction from the top wall side of the housing 410 toward the bottom wall side of the housing 410. In FIGS. 5 and 6, for ease of viewing, only one tube member 511 is denoted by a reference numeral, and the reference numerals of the other tube members 511 are omitted. Among the plurality of tube members 511, the tube member located at the innermost side is referred to as a tube member 511a and the tube member located at the outermost side is referred to as a tube member 511b, and the tube member 511 is referred to any of the tube members 511a, 511b and tube members located between the tube members 511a, 511b unless otherwise specified. Although FIGS. 5 and 6 show an example in which the number of tube members 511 is seven, the number of tube members 511 may be other than seven. Each tube member 511 has a cylindrical shape, the inner diameter of the outer tube member 511 is larger than the outer diameter of the inner tube member 511 adjacent to the tube member 511, and the outer tube member 511 surrounds the outer peripheral surface of the inner tube member 511 through a gap. The gaps in the horizontal direction are approximately the same in length, respectively. Each tube member 511 of the present embodiment has substantially the same length. The tube member 511 is formed of, for example, metal such as stainless steel, aluminum, nickel, or copper.

The inner diameter, outer diameter, and thickness of each of the tube members 511 are not particularly limited as long as a gap is formed between the tube members 511. As long as each tube member 511 includes a hollow portion, the shape of each tube member 511 is not limited to a cylindrical shape, and each tube member 511 may have the same shape or a different shape. The materials of the respective tube members 511 may be the same as or different from each other. The gaps between the tube members 511 in the horizontal direction may have different lengths.

The center axis of each tube member 511 is located coaxially with the center axis of the gas inlet port 410b along the vertical direction. One end of each tube member 511 is located to face the gas inlet port 410b on the downstream side of the flow path from the top wall of the housing 410. Further, the one end of each tube member 511 is located at the same position in the center axis direction of the tube member 511. The other end of each tube member 511 opposite to the one end is located at substantially the same position as the edge of the gas exhaust port 410c farthest from the bottom wall of the housing 410 in the vertical direction, or located upstream of the edge in the flow path. Further, the other end of each tube member 511 is located at the same position in the center axis direction of the tube member 511. In this manner, the multiple tube 510 is arranged on the flow path of the residual gas that travels from the gas inlet port 410b to the gas exhaust port 410c through the internal space 410a.

The outer diameter of the tube member 511b is substantially the same as the diameter of the gas inlet port 410b, and the outer peripheral surface of the tube member 511b is located below the peripheral surface of the gas inlet port 410b. Further, a gap is formed between the outer peripheral surface of the tube member 511b and the side wall of the housing 410. In the horizontal direction, the gap is longer than the gap between the tube members 511. The outer diameter of the tube member 511b may be smaller or larger than the diameter of the gas inlet port 410b. The inner diameter of the tube member 511b may be substantially the same as the diameter of the gas inlet port 410b. The gap between the outer peripheral surface of the tube member 511b and the side wall of the housing 410 may be smaller than or the same as the gap between the tube members 511.

As shown in FIG. 6, the fixing member 530a is arranged at one end of the respective tube members 511, and the fixing member 530b is arranged at the other end of the respective tube members 511. The fixing member 530a is a substantially cross-shaped member, and is arranged substantially along the horizontal direction substantially perpendicular to the tube members 511. Two sides of the cross-shaped fixing member 530a have a quadrangular prism shape, and lengths of the sides are substantially the same as the outer diameter of the tube member 511b. The two sides of the cross-shaped fixing member 530a may be formed by fixing two rod-shaped members so as to intersect at right angles. The fixing member 530a is formed of the same metal as the tube member 511. Since the configuration of the fixing member 530b is the same as the configuration of the fixing member 530a, description thereof will be omitted.

The fixing members 530a, 530b sandwich the respective tube members 511 from one end side and the other end side of the tube members 511, are fixed to one end and the other end of the respective tube members 511 by welding or the like, and fix the relative position of one end of the respective tube members 511 and the relative position of the other end of the respective tube members 511. As a result, the respective tube members 511 are configured as one multiple tube 510 without being disassembled, and are positioned in the circumferential direction and the radial direction of the tube members 511. In addition, by the fixing, the interval between the respective tube members 511 is fixed without change. The multiple tube 510 configured as described above is fixed to the side wall of the housing 410 through a damper (not shown).

The shapes of the fixing members 530a, 530b are not particularly limited as long as the respective tube members 511 are fixed. In addition, as long as the interval between the respective tube members 511 is fixed, grooves may be arranged at one end and the other end of the respective tube members 511, and the fixing members 530a, 530b may be fitted into the grooves. Alternatively, the fixing members 530a, 530b may be provided with grooves, and the ends of the respective tube members 511 may be fitted into the grooves. In addition, the lengths of the fixing members 530a, 530b may be longer than the outer diameter of the tube member 511b, and the fixing members 530a, 530b may be fixed to the side wall of the housing 410, thereby positioning the multiple tube 510 in the internal space 410a of the housing 410.

Here, in the fixing member 530a, an intersecting portion of the cross-shaped fixing member 530a is arranged at one end of the tube member 511a. In the tin trap device 400 of the present embodiment, the intersecting portion is a gas travel direction changing member 550 of the present embodiment, and is in contact with the one end. The gas travel direction changing member 550 is a cover that closes an opening 513 located at the one end of the tube member 511a, and is a member separate from the tube member 511. As shown in FIG. 5, the gas travel direction changing member 550 has a flat plate shape, the outer diameter of the gas travel direction changing member 550 is substantially the same as the outer diameter of the tube member 511a, and the main surface of the gas travel direction changing member 550 is substantially perpendicular to the travel direction of the residual gas. Since the tube member 511a of the present embodiment has a cylindrical shape, it is preferable that the gas travel direction changing member 550 has a circular shape, but the shape of the gas travel direction changing member 550 is not particularly limited as long as the opening 513 can be closed. Here, at one end of the multiple tube 510 where the cross-shaped fixing member 530a is arranged as described above, a portion other than the gas travel direction changing member 550, which is the intersecting portion of the fixing member 530a, is arranged at the one end of the multiple tube 510 except for the opening 513. However, most of the one end is open without being closed by the portion other than the gas travel direction changing member 550 so that the residual gas flows into the gaps of the multiple tube 510 located outside the tube member 511a. In order to illustrate the opening at the one end, in FIG. 5, illustration of portions other than the gas travel direction changing member 550, which is an intersecting portion of the fixing member 530a, is omitted. Further, the cross-shaped fixing member 530b is arranged at the other end of the multiple tube 510, an intersecting portion 530d of the fixing member 530b is arranged at the other end of the tube member 511a, and a portion of the fixing member 530b other than the intersecting portion 530d is arranged at the other end of the multiple tube 510 except for an opening located at the other end of the tube member 511a. Most of the other end of the multiple tube 510 is opened without being closed by a portion other than the intersecting portion 530d of the fixing member 530b so that the residual gas flows out from the gaps of the multiple tube 510 located outside the tube member 511a. In FIG. 5, in order to illustrate the opening at the other end, illustration of portions of the fixing member 530b other than the intersecting portion 530d is omitted.

Among the residual gas traveling from the gas inlet port 410b to the multiple tube 510, the fastest residual gas tends to pass on the center axis of the gas inlet port 410b. Here, description will be provided on the flow of the fastest residual gas in the case where the gas travel direction changing member 550 is not arranged unlike the tin trap device 400 of the present embodiment. When the gas travel direction changing member 550 is not arranged, the fastest residual gas flows into the hollow portion of the tube member 511a from the opening 513, and passes through the hollow portion extending along the vertical direction from the upstream side to the downstream side. Therefore, when the gas travel direction changing member 550 is not arranged, the opening 513 and the hollow portion of the tube member 511a serve as a flow path on which the fastest residual gas flows. However, in the multiple tube 510 of the present embodiment, since the gas travel direction changing member 550 closes the opening 513 as described above, the gas travel direction changing member 550 changes the travel direction of at least the fastest residual gas among the residual gas with respect to the travel direction of the fastest residual gas in the case where the gas travel direction changing member 550 is not arranged.

The gas travel direction changing member 550 changes the travel direction of the fastest residual gas to a direction different from the vertical direction. The gas travel direction changing member 550 of the present embodiment changes the travel direction of the fastest residual gas so that the fastest residual gas flows through a portion other than the opening 513 from the opening 513 of the tube member 511a through which the fastest residual gas is to flow when the gas travel direction changing member 550 is not arranged. In the tin trap device 400 of the present embodiment, the portion other than the opening 513 is a gap in the multiple tube 510 located outside the tube member 511a. The gap is a gap between the tube member 511a and the tube member 511 adjacent to the tube member 511a, a gap between the tube members 511 located between the tube members 511a, 511b, and a gap between the tube member 511b and the tube member 511 adjacent to the tube member 511b.

The trap main body 430 of the present embodiment is arranged on the flow path of the residual gas in the housing 410 similarly to the trap main body 430 of the comparative example, but unlike the trap main body 430 of the comparative example, the heater 433 is not arranged. Therefore, the trap main body 430 of the present embodiment is heated by the residual gas flowing through the trap main body 430. The temperature of the residual gas is a temperature at which tin deposited from the residual gas adheres to the tube member 511. The temperature is generally 20° C. or higher and 70° C. or lower. Therefore, the trap main body 430 is heated by the residual gas flowing through the trap main body 430 to approximately 20° C. or higher and 70° C. or lower.

4.2 Operation

Next, operation of the tin trap device 400 of the present embodiment will be described.

In the tin trap device 400 of the present embodiment, similarly to the tin trap device 400 of the comparative embodiment, the residual gas flows from the internal space of the chamber device 10 to the internal space 410a of the housing 410 through the exhaust pipe 10p and the gas inlet port 410b. In addition, the residual gas travels from the gas inlet port 410b side toward the multiple tube 510 along the vertical direction at the internal space 410a of the housing 410.

Among the residual gas traveling from the gas inlet port 410b to the multiple tube 510, the fastest residual gas tends to pass on the center axis of the gas inlet port 410b and travels toward one end of the tube member 511a. The opening 513 located at the one end is closed by the gas travel direction changing member 550. Therefore, the inflow of the fastest residual gas into the hollow portion of the tube member 511a from the opening 513 and the passage of the fastest residual gas through the hollow portion are suppressed by the gas travel direction changing member 550.

When the fastest residual gas travels to the gas travel direction changing member 550, the travel direction of the fastest residual gas is changed by the gas travel direction changing member 550. Since the gas travel direction changing member 550 of the present embodiment is arranged substantially perpendicular to the travel direction of the fastest residual gas, the residual gas collides with the gas travel direction changing member 550, and the travel direction of the residual gas is bent by collision substantially to the horizontal direction from the vertical direction. The residual gas bent substantially to the horizontal direction travels, together with other residual gas, to the gaps between the tube members 511, which are the flow paths in the multiple tube 510. The other residual gas flows on the outer side of the fastest residual gas in the gas inlet port 410b, and flows on the edge side of the gas inlet port 410b than the fastest residual gas. Since the gas travel direction changing member 550 is not located in the travel direction of the other residual gas, collision of the other residual gas with the gas travel direction changing member 550 is suppressed, and the other residual gas travels to the gap between the tube members 511 located in front in the travel direction of the other residual gas. The fastest residual gas and the other residual gas having traveled into the gap come into contact with the outer peripheral surface of the inner tube member 511 and the inner peripheral surface of the outer tube member 511 surrounding the inner tube member 511, as forming the gap, and flow along the peripheral surfaces in the vertical direction. Further, the flow velocity of the fastest residual gas is reduced by the collision with the gas travel direction changing member 550 as compared with the case where the gas travel direction changing member 550 is not arranged and the residual gas flows through the hollow portion of the tube member 511a. Therefore, the fastest residual gas flows through the above-described gap toward the downstream side along the vertical direction in a state in which the flow velocity is reduced.

The trap main body 430 of the present embodiment is heated by the residual gas flowing through the trap main body 430, and the temperature of the trap main body 430 is approximately 20° C. or higher and 70° C. or lower. At least some of stannane contained in the residual gas is decomposed to hydrogen and tin by the temperature. Therefore, the residual gas contains hydrogen, tin atoms turned into plasma by laser irradiation and neutralized by recombination, and tin atoms generated from fine particles and stannane. When at least some of tin contained in the residual gas comes into contact with the tube member 511, tin adheres to the tube member 511 in a film-like manner without melting. Even if the temperature of the tube member 511 through which the residual gas flows is approximately 20° C. or higher and 40° C. or lower, stannane is decomposed to hydrogen and tin, and tin is deposited on the tube member 511. In general, stannane decomposes at room temperature, and the decomposition of stannane is remarkable at 100° C. or higher.

Figure 7:
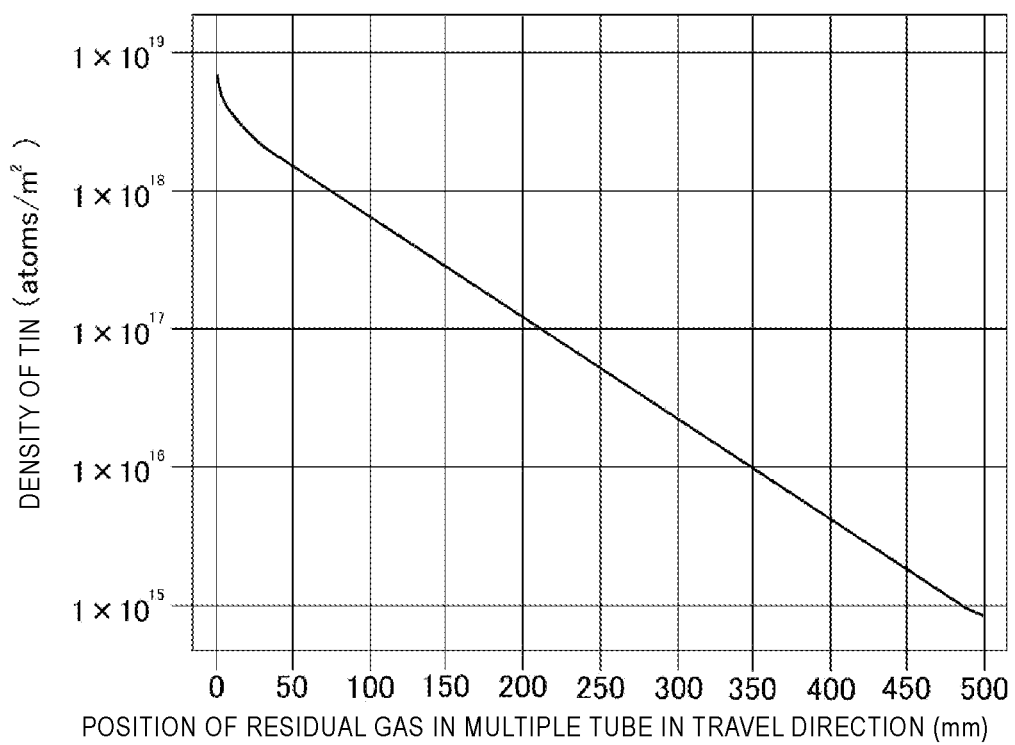
FIG. 7 is a diagram showing the relationship between a position of residual gas in the multiple tube in a travel direction and the density of tin adhering at the position.

FIG. 7 is a diagram showing the relationship between a position of the residual gas in the multiple tube 510 in the travel direction and the density of tin adhering at the position. In the relationship shown in FIG. 7, the inner diameters of the respective tube members 511 are generally 260 mm, 200 mm, 160 mm, 120 mm, 80 mm, 40 mm, and 20 mm. The length of each tube member 511 is approximately 500 mm, and the thickness of each tube member 511 is approximately 2 mm. The flow rate of the residual gas is 50 Nlm, the pressure of the residual gas at the gas inlet port 410b is 83.3 Pa, and the pressure of the residual gas at the gas exhaust port 410c is 85 Pa. In the horizontal axis shown in FIG. 7, the left side is one end side of the tube member 511, and the right side is the other end side of the tube member 511. As can be seen from FIG. 7, the density of tin decreases as the tin travels downstream through the tube member 511. Therefore, it can be seen that the amount of tin contained in the residual gas after passing through the gap between the tube members 511 is smaller than that before passing through the gap between the tube members 511.

Together with hydrogen, the tin-reduced residual gas passes through the gaps between the tube members 511, flows toward the bottom wall of the housing 410, is bent to the horizontal direction from the vertical direction by suction of the exhaust pump 453, and flows toward the gas exhaust port 410c. The residual gas flowing to the gas exhaust port 410c is sucked into the exhaust pump 453 through the exhaust pipe 451 from the gas exhaust port 410c.

Here, the fastest residual gas bent by the collision with the gas travel direction changing member 550 and some of the other residual gas may flow through the gap between the outer peripheral surface of the tube member 511b and the side wall of the housing 410. In this case, since the housing 410 is heated to approximately 20° C. or higher and 70° C. or lower by the residual gas, tin may adhere to the sidewall of the housing 410. The residual gas flowing through the gap is sucked into the exhaust pump 453 through the exhaust pipe 451 from the gas exhaust port 410c as described above. In addition, since the temperature of the fixing members 530a, 530b and the gas travel direction changing member 550 is approximately 20° C. or higher and 70° C. or lower, tin may adhere to the fixing members 530a, 530b and the gas travel direction changing member 550.

4.3 Effect

In the tin trap device 400 of the present embodiment, the multiple tube 510 includes the plurality of tube members 511 and is arranged on the flow path of the residual gas. The temperature of the multiple tube 510 is a temperature at which tin deposited from the residual gas adheres to the tube member 511. The gas travel direction changing member 550 changes the travel direction of at least the fastest residual gas among the residual gas traveling from the gas inlet port 410b to the multiple tube 510.

In the case where the gas travel direction changing member 550 is not arranged unlike the tin trap device 400 of the present embodiment, the fastest residual gas flows in from the opening 513 located at one end of the tube member 511a and flows through the hollow portion of the tube member 511a. In the tin trap device 400 of the present embodiment, the gas travel direction changing member 550 changes the travel direction of the fastest residual gas such that the fastest residual gas travels, rather than the opening 513 and the hollow portion of the tube member 511a, to the gap between the other tube members 511. Here, a comparison is made between a case where the fastest residual gas flows through the hollow portion of the tube member 511a and a case where the fastest residual gas flows through the gap between the tube members 511. When the fastest residual gas flows through the hollow portion of the tube member 511a, the fastest residual gas is in contact with only the inner peripheral surface of the tube member 511a. However, when the fastest residual gas flows through the gap between the tube members 511, the fastest residual gas is in contact with the outer circumferential surface of the inner tube member 511 and the inner circumferential surface of the outer tube member 511 surrounding the inner tube member 511. Therefore, in the tin trap device 400 of the present embodiment, the contact surface of the tube member 511 with respect to the fastest residual gas is increased compared to the case where the fastest residual gas flows through the hollow portion of the tube member 511a, and the fastest residual gas can sufficiently contact the peripheral surface of the tube member 511. Further, since the temperature of the multiple tube 510 is a temperature at which tin deposited from the residual gas adheres to the tube member 511, when the residual gas is sufficiently in contact with the peripheral surface of the tube member 511 as described above, tin can be deposited from the residual gas before the residual gas passes through the multiple tube 510. In this case, the adhered amount of tin to the tube member 511 may be increased as compared with the case where the residual gas is not sufficiently in contact with the peripheral surface of the tube member 511. Therefore, tin contained in the residual gas is reduced after passing through the gap between the tube members 511, as compared with before passing through the gap between the tube members 511, and passage of tin through the gap between the tube members 511 is suppressed. When the passage of tin is suppressed, the suction of tin into the exhaust pump 453 can be suppressed, and increase in the adhered amount of tin to the exhaust pump 453 can be suppressed. When the increase in the adhered amount of tin is suppressed, decrease in the exhaust capacity of the exhaust pump 453 is suppressed, and decrease in the reliability of the EUV light generation apparatus 100 due to the decrease is suppressed.

Further, in the tin trap device 400 of the present embodiment, when the fastest residual gas flows through the gap between the tube members 511 due to the gas travel direction changing member 550, the flow velocity of the fastest residual gas is reduced as compared with the case where the fastest residual gas flows through the hollow portion of the tube member 511a. When the flow velocity is reduced, the stay time of the residual gas in the gap between the tube members 511 and the contact time of the residual gas in contact with the tube members 511 increase. Longer stay time and contact time may increase the deposited amount of tin, may prevent the fastest residual gas from passing through the gap between the tube members 511 before the tin is deposited from the fastest residual gas, and may increase the adhered amount of tin on the tube members 511.

Further, in the tin trap device 400 of the present embodiment, the gas travel direction changing member 550 changes the travel direction of the fastest residual gas so that the fastest residual gas flows through a portion other than the opening 513 from the opening 513 of the tube member 511a into which the fastest residual gas is to flow when the gas travel direction changing member 550 is not arranged. As a result, the inflow of the fastest residual gas into the hollow portion of the tube member 511a and the passage of the residual gas through the hollow portion are suppressed. When the inflow and the passage are suppressed, tin contained in the residual gas is suppressed from being sucked into the exhaust pump 453, and increase in the adhered amount of tin in the exhaust pump 453 can be suppressed.

Further, in the tin trap device 400 of the present embodiment, the plurality of tube members 511 are concentrically arranged, and the tube member 511a includes an opening 513. In addition, the gas travel direction changing member 550 changes the travel direction of the fastest residual gas so that the fastest residual gas flows from the opening 513 to the gap in the multiple tube 510 located outside the tube member 511a. Therefore, the contact surface of the tube member 511 with respect to the fastest residual gas is increased compared to the case where the fastest residual gas flows through the hollow portion of the tube member 511a, and the fastest residual gas can be sufficiently in contact with the peripheral surface of the tube member 511.

In the tin trap device 400 of the present embodiment, the gas travel direction changing member 550 closes the opening 513. As a result, the inflow of the fastest residual gas into the hollow portion of the tube member 511a and the passage of the residual gas through the hollow portion are more suppressed than when the gas travel direction changing member 550 is arranged away from the opening 513. When the inflow and the passage are suppressed, tin contained in the residual gas is suppressed from being sucked into the exhaust pump 453, and increase in the adhered amount of tin in the exhaust pump 453 can be suppressed. As long as the inflow of the fastest residual gas into the hollow portion of the tube member 511a and the passage of the residual gas through the hollow portion are suppressed, the gas travel direction changing member 550 may be arranged between the opening 513 and the gas inlet port 410b.

Further, in the tin trap device 400 of the present embodiment, the gas travel direction changing member 550 has a flat plate shape, and the main surface of the gas travel direction changing member 550 is substantially perpendicular to the travel direction of the fastest residual gas. Thus, the residual gas collides with the gas travel direction changing member 550, the traveling direction of the residual gas is bent substantially to the horizontal direction from the vertical direction by the collision, and the residual gas can travel to the gap between the tube members 511.

Here, the gas travel direction changing member 550 may have a conical shape and be arranged such that the apex of the gas travel direction changing member 550 directs to the gas inlet port 410b, and the peripheral edge of the bottom surface of the conical shape may be arranged on the peripheral edge of one end of the tube member 511a. The apex of the gas travel direction changing member 550 is preferably located on the center axis of the gas inlet port 410b. Since the tube member 511a of the present embodiment has a cylindrical shape, it is preferable that the gas travel direction changing member 550 has a circular cone shape. Alternatively, the gas travel direction changing member 550 may have a truncated conical shape with an open bottom surface, the upper surface of the gas travel direction changing member 550 may be arranged toward the gas inlet port 410b, and the peripheral edge of the bottom surface of the truncated cone may be arranged at the peripheral edge of one end of the tube member 511a. Since the tube member 511a of the present embodiment has a cylindrical shape, it is preferable that the gas travel direction changing member 550 has a circular truncated cone shape.

Further, in the tin trap device 400 of the present embodiment, the gas travel direction changing member 550 is an intersecting portion of the fixing member 530a. Accordingly, in the tin trap device 400 of the present embodiment, the number of components can be reduced as compared with the case where the gas travel direction changing member 550 is a member separate from the fixing member 530a. Here, the gas travel direction changing member 550 may be a part of the fixing member 530a. Further, the gas travel direction changing member 550 may be a member separate from the fixing member 530a. When the gas travel direction changing member 550 is a member separate from the fixing member 530a, the gas travel direction changing member 550 may be integrated with the tube member 511a. When the gas travel direction changing member 550 is integrated with the tube member 511a, the gas travel direction changing member 550 may be configured as a top wall at one end of the tube member 511a. Therefore, the tube member 511a is configured as a cylindrical member with one end closed. Alternatively, the gas travel direction changing member 550 may be integrated with the tube member 511a by welding or the like. Alternatively, the gas travel direction changing member 550 may be a member separate from the fixing member 530a and the tube member 511a.

In the tin trap device 400 of the present embodiment, each tube members 511 has substantially the same length. The fixing member 530b fixes the relative position of the other end of each tube member 511, and sandwiches each tube member 511 together with the fixing member 530a from one end side and the other end side of the tube member 511. Thus, as compared with the case where only one of the fixing member 530a and the fixing member 530b is arranged, the displacement of the tube member 511 in the circumferential direction and the radial direction can be suppressed.

In the tin trap device 400 of the present embodiment, the temperature of the tin trap device 400 is approximately 20° C. or higher and 70° C. or lower. Thus, tin contained in the residual gas may adhere to the tube member 511. Here, when the temperature of the tube member 511 is approximately 70° C. or higher and lower than the melting point of tin, cotton-like tin may be deposited from the residual gas, and the cotton-like tin may adhere to the tube member 511. When the cotton-like tin adheres to the tube member 511, the flow path is blocked by the tin and the residual gas is less likely to flow than in a case where the tin adheres to the tube member 511 in a film-like manner. In the tube member 511 of the present embodiment, since tin adheres to the tube member 511 in a film-like manner as described above, the residual gas can flow more easily as compared with the case where tin adheres to the tube member 511 in a cotton-like manner.

In the tin trap device 400 of the comparative example, as described above, the plate-like member 431 is heated to a temperature of 231.93° C. or higher and 2602° C. or lower, and thus the housing 410 is also heated to the temperature. When the EUV light generation apparatus 100 of the comparative example is subject to maintenance, it takes time to lower the temperature. However, since the tin trap device 400 of the present embodiment is heated approximately to 20° C. or higher and 70° C. or lower, the time for lowering the temperature may be shorter than that of the EUV light generation apparatus 100 of the comparative example. Therefore, the time required for maintenance of the EUV light generation apparatus 100 can be shortened. Further, in the tin trap device 400 of the comparative example, a heat shield cover or the like is required to protect an operator who performs maintenance of the EUV light generation apparatus 100 from burns. However, in the tin trap device 400 of the present embodiment, when the temperature of the tin trap device 400 is, for example, approximately 20° C. or higher and 40° C. or lower, a heat shielding cover or the like may be unnecessary.

In the tin trap device 400 of the present embodiment, tin adhering to the tube member 511 may fall from the tube member 511 in a solid state and be collected in the drain tank 410d. When the solid-state tin is collected in the drain tank 410d, the solid-state tin is prevented from traveling to the exhaust pipe 451 and the exhaust pump 453, and clogging of the exhaust pipe 451 and the exhaust pump 453 by the solid-state tin is suppressed. As a result, decrease in reliability of the exhaust pipe 451 and the exhaust pump 453 is suppressed, and decrease in reliability of the EUV light generation apparatus 100 due to the decrease is suppressed.

One end of the tube member 511b may be in contact with the top wall, and the tube member 511b may suppress traveling of the residual gas from the gas inlet port 410b into the gap between the outer peripheral surface of the tube member 511b and the side wall of the housing 410.

The gas travel direction changing member 550 may close at least a part of one end of the tube member 511a. The gas travel direction changing member 550 may change the travel direction of the residual gas having a flow velocity lower than that of the fastest residual gas in the same manner as the fastest residual gas. Thus, the gas travel direction changing member 550 may change the travel direction of the residual gas traveling toward the gas travel direction changing member 550.

When the gas travel direction changing member 550 is not arranged and the fastest residual gas flows through the flow path of the multiple tube 510 other than the opening 513 and the hollow portion of the tube member 511a, the gas travel direction changing member 550 may close the flow path. For example, when the gas travel direction changing member 550 is not arranged and the fastest residual gas flows through the gap between the tube member 511a and the tube member 511 adjacent to the tube member 511a, the gas travel direction changing member 550 may close the opening at one end of the tube members 511a, 511 in the gap. That is, the gas travel direction changing member 550 may be arranged on the flow path of the fastest residual gas at one end of the multiple tube 510.

In addition, the plurality of tube members 511 do not need to be concentrically arranged, and among the plurality of tube members 511, the outer tube member 511 may surround the outer circumferential surface of the inner tube member 511 with a gap therebetween, and the center axis of the outer tube member 511 may be arranged to be shifted in the horizontal direction from the center axis of the inner tube member 511. Alternatively, a plurality of tube members 511 may be arranged inside the tube member 511b, and for example, the plurality of tube members 511 may be arranged on the circumference of the same circle with respect to the center axis of the tube member 511b.

Figure 8:
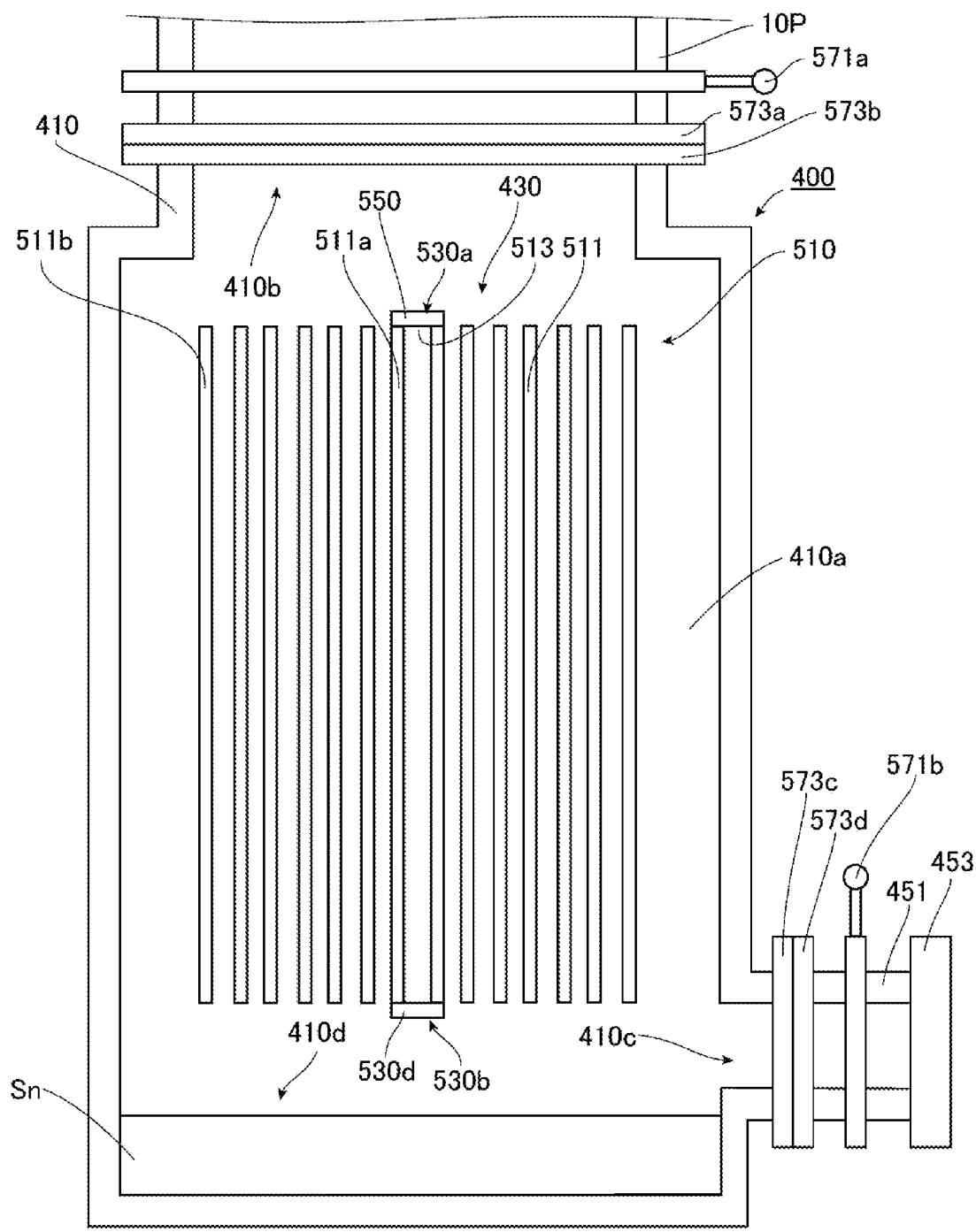
FIG. 8 is a schematic view showing a schematic configuration example of a part including the tin trap device according to a first modification of the first embodiment.

In the tin trap device 400 of the present embodiment, it is preferable that the gas inlet port 410b is integrated with the exhaust pipe 10p of the chamber device 10, and the gas exhaust port 410c is integrated with the exhaust pipe 451 of the exhaust pump 453. However, the present invention is not limited thereto, and another example of the gas inlet port 410b and the gas exhaust port 410c will be described with reference to a first modification. FIG. 8 is a schematic view showing a schematic configuration example of a part including the tin trap device 400 according to the first modification of the first embodiment. In FIG. 8, illustration of portions of the fixing member 530a other than the gas travel direction changing member 550, which is the intersecting portion, and illustration of portions of the fixing member 530b other than the intersecting portion 530d are omitted.

In the tin trap device 400 of the present modification, the gas inlet port 410b is detachably attachable to the exhaust pipe 10P, and the gas exhaust port 410c is detachably attachable to the exhaust pipe 451. Gate valves 571a, 571b are arranged in the exhaust pipe 10P and the exhaust pipe 451 of the present modification. In the tin trap device 400 of the present modification, at least one of the gate valves 571a, 571b may be arranged. Connection members 573a, 573b are arranged in the exhaust pipe 10P and the gas inlet port 410b of the present modification, and connection members 573c, 573d are arranged in the gas exhaust port 410c and the exhaust pipe 451 of the present modification. The connection members 573a, 573b, 573c, 573d are, for example, ConFlat flanges. Here, the housing 410 and the exhaust pipe 451 may be bellows-shaped on the upstream side or the downstream side of the connection members 573a, 573b, 573c, 573d.

When the tin trap device 400 is to be replaced, in a state where the gate valves 571a, 571b are closed, the connection of the connection members 573a, 573b is released, the connection of the connection members 573c, 573d is released, and the housing 410 is removed from the exhaust pipe 10P and the exhaust pipe 451. The housing 410 housing the trap main body 430 with tin adhering is replaced with another housing 410 housing the trap main body 430 without tin adhering, and the other housing 410 is attached to the exhaust pipe 10P and the exhaust pipe 451.

In the tin trap device 400 of the present modification, the tin trap device 400 is capable of being replaced with another tin trap device 400. Therefore, even if tin adheres to the tin trap device 400, there is no need to remove the adhering tin from the tin trap device 400, and downtime of the EUV light generation apparatus 100 may be shorter than in the case of removing the adhering tin.

In the tin trap device 400 of the present modification, the trap main body 430 with tin adhering may be removed from the housing 410 and be replaced with a trap main body 430 without tin adhering. The housing 410 is reattached to the exhaust pipe 10P and the exhaust pipe 451 in a state that the trap main body 430 without tin adhering is housed therein. In this manner, the housing 410 may be reused.

Figure 9:
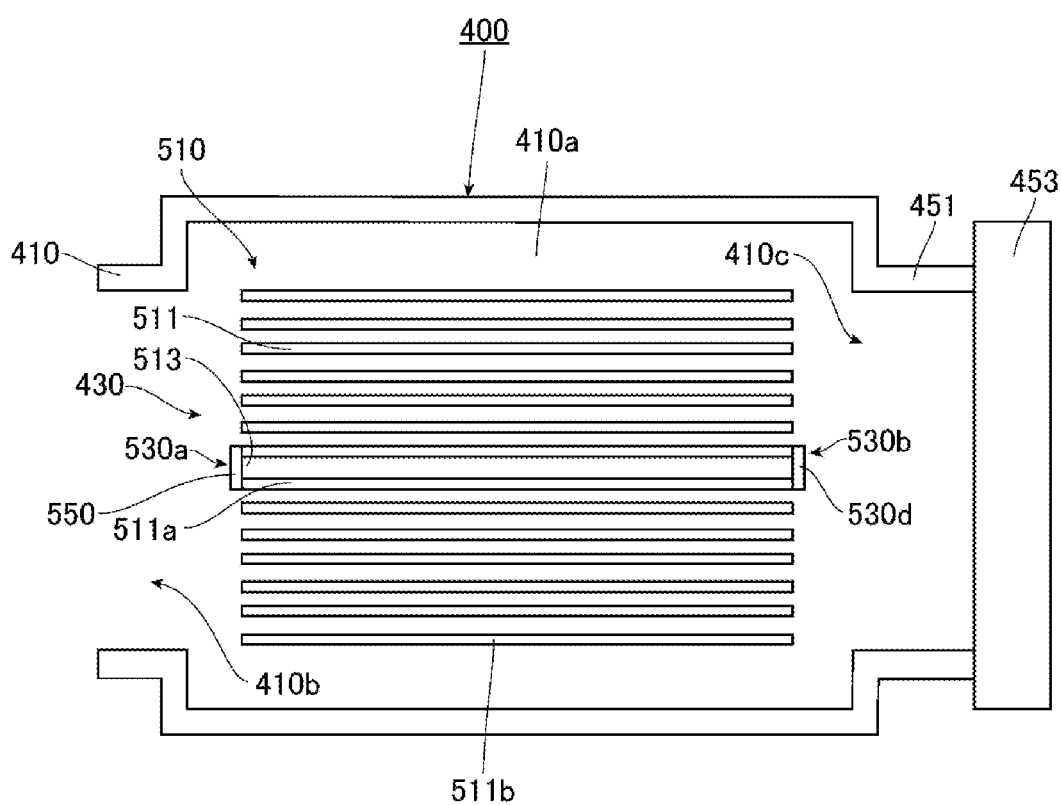
FIG. 9 is a schematic view showing a schematic configuration example of a part including the tin trap device according to a second modification of the first embodiment.

Next, a second modification of the first embodiment will be described. In the tin trap device 400 of the present embodiment, the center axis direction of the housing 410 and the tube member 511 is along the vertical direction, but the present invention is not limited thereto. Another example of the direction along the center axis direction of the housing 410 and the tube member 511 will be described with reference to a second modification. FIG. 9 is a schematic view showing a schematic configuration example of a part including the tin trap device 400 according to the second modification of the first embodiment. In FIG. 9, illustration of portions of the fixing member 530a other than the gas travel direction changing member 550, which is the intersecting portion, and illustration of portions of the fixing member 530b other than the intersecting portion 530d are omitted.

The center axis direction of the housing 410 and the tube member 511 of the present modification is along the horizontal direction. Further, the exhaust pipe 451 and the exhaust pump 453 of the present modification is arranged to face the other end of the tube member 511. As a result, the flow path of the residual gas flowing from the gas inlet port 410b toward the exhaust pump 453 becomes linear along the horizontal direction, the residual gas flows along the horizontal direction being the travel direction, and the residual gas can easily flow to the exhaust pump 453 compared to the case where the flow path of the residual gas is bent. Here, the center axis direction of the tube member 511 and the travel direction of the residual gas may be other than the vertical direction and the horizontal direction, and may be inclined to these directions.

5. DESCRIPTION OF TIN TRAP DEVICE OF SECOND EMBODIMENT

Next, the configuration of the tin trap device 400 according to a second embodiment will be described. Any component same as that described above is denoted by an identical reference sign, and duplicate description thereof is omitted unless specific description is needed.

5.1 Configuration

Figure 10:
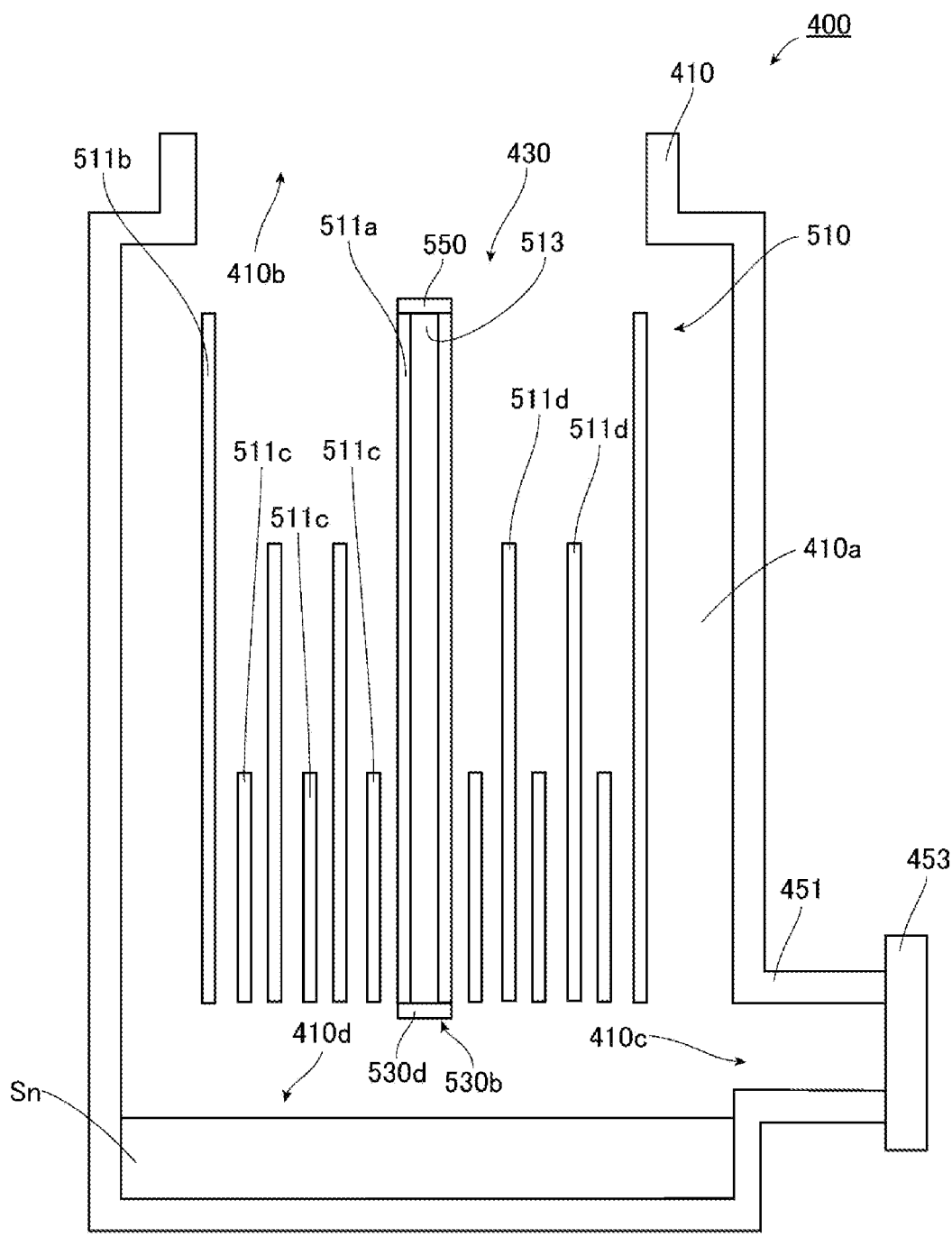
FIG. 10 is a schematic view showing a schematic configuration example of a part including the tin trap device according to a second embodiment.

FIG. 10 is a schematic view showing a schematic configuration example of a part including the tin trap device 400 according to the present embodiment. As shown in FIG. 10, in the trap main body 430 of the tin trap device 400 of the present embodiment, the configuration of the multiple tube 510 is different from that of the multiple tube 510 of the first embodiment.

In the multiple tube 510 of the present embodiment, the tube member 511a and the tube member 511b have substantially the same length as each other, and are longer than tube members 511c, 511d arranged between the tube member 511a and the tube member 511b. Each tube member 511c has substantially the same length and each tube member 511d has substantially the same length. The tube member 511c is shorter than the tube member 511d, and the tube members 511c, 511d having different lengths are alternately arranged. FIG. 10 shows an example in which the tube member 511c, the tube member 511d, the tube member 511c, the tube member 511d, and the tube member 511c are arranged in this order from the tube member 511a to the tube member 511b. Here, it is also possible that the tube member 511d, the tube member 511c, the tube member 511d, the tube member 511c, and the tube member 511d are arranged in this order. Therefore, in the multiple tube 510 of the present embodiment, the tube members 511 adjacent in the horizontal direction have different lengths from each other, and the tube member having a different length from the tube member 511 is arranged in the gap between the two tube members 511 having the same length.

One end of each of the tube members 511a and 511b, one end of each of the tube members 511c, and one end of each of the tube members 511d are located at positions different from each other in the center axis direction of the multiple tube 510. However, the other ends of the tube members 511a, 511b, the other ends of the tube members 511c, and the other ends of the tube members 511d are located at the same position in the center axis direction of the multiple tube 510. Therefore, in the trap main body 430 of the present embodiment, the tube members 511a, 511b, 511c, 511d are arranged such that the arrangement densities of the tube members 511a, 511b, 511c, 511d in the multiple tube 510 are lower on the upstream side than on the downstream side in the flow path of the residual gas.

In the trap main body 430 of the present embodiment, the fixing member 530a is omitted, the fixing member 530b is arranged, and the other ends of the tube members 511a, 511b, 511c, 511d are fixed to the fixing member 530b. In FIG. 10, illustration of portions of the fixing member 530b other than the intersecting portion 530d is omitted.

The gas travel direction changing member 550 of the present embodiment is a member separate from the tube member 511a, and is fixed to one end of the tube member 511a. The gas travel direction changing member 550 is a circular plate material. As described above, the gas travel direction changing member 550 may be configured as a top wall at one end of the tube member 511a.

5.2 Effect

In the multiple tube 510 of the present embodiment, the arrangement densities of the tube members 511a, 511b, 511c, 511d are lower on the upstream side than on the downstream side in the flow path of the residual gas. Accordingly, compared to the case where the arrangement density is constant on the upstream side and the downstream side, concentration of the adhering of tin on the upstream side is suppressed, clogging of the flow path due to tin is suppressed, and the residual gas can easily flow. Accordingly, the lifetime of the tin trap device 400 may be increased.

In the multiple tube 510 of the present embodiment, the tube members 511a, 511b, 511c, 511d are densely arranged on the downstream side, but the tin concentration in the residual gas decreases on the downstream side. Therefore, on the downstream side of the tube members 511a, 511b, 511c, 511d, the speed at which tin adhering to the tube members 511a, 511b, 511c, 511d is stacked can be suppressed. When the speed is suppressed, clogging of the flow path due to tin is suppressed even if the interval between the tube members 511a, 511b, 511c, 511d is narrower than that on the upstream side, and the residual gas can easily flow.

In the multiple tube 510 of the present embodiment, the tube members 511a, 511b are longer than the tube members 511c, 511d. Accordingly, when the travel direction of the fastest residual gas is changed by the gas travel direction changing member 550, the fastest residual gas can easily flow between the tube member 511a and the tube member 511b. Further, if the tube members 511c, 511d are longer than the tube members 511a, 511b, the tube members 511c, 511d may become obstacles and prevent the residual gas from traveling from the tube member 511a side to the tube member 511b side. However, in the multiple tube 510 of the present embodiment, the tube members 511c, 511d are shorter than the tube members 511a, 511b. Therefore, it is possible to suppress obstruction of the traveling of the residual gas from the tube member 511a side to the tube member 511b side.

Further, in the multiple tube 510 of the present embodiment, the tube members 511c, 511d are arranged alternately. As a result, as compared with a case where two tube members 511d having the same length are arranged adjacent to each other in the horizontal direction, the gap between the tube members 511d can be widened in the horizontal direction, and the residual gas can easily flow into the gap between the tube members 511d. Further, even if tin adheres to one end side of the tube member 511d, since the gap is widened as described above, clogging of the flow path on the one end side of the tube members 511d is suppressed, and the residual gas can easily flow into the gap between the tube member 511c and the tube member 511d.

One of the tube member 511a and the tube member 511b may be longer than the other. When the tube member 511a is longer than the tube member 511b, the residual gas may easily flow between the multiple tube 510 and the side wall of the housing 410. Also, when the tube member 511b is longer than the tube member 511a, the residual gas may easily flow into the inside of the multiple tube 510.

The tube member 511b may have the same length as the tube member 511d when the tube member 511b is adjacent to the tube member 511c, or may have the same length as the tube member 511c when the tube member 511b is adjacent to the tube member 511d.

In FIG. 10, the tube members 511c, 511d having different lengths located between the tube members 511a, 511b are alternately arranged, but the present invention is not limited thereto. Among the plurality of tube members 511 located between the tube member 511a and the tube member 511b, the tube member 511 on the inner side may be longer. Here, the flow velocity of the residual gas traveling from the gas inlet port 410b to the multiple tube 510 tends to be higher on the center axis side of the gas inlet port 410b and lower on the edge side of the gas inlet port 410b. Therefore, the flow velocity of the residual gas passing through the multiple tube 510 tends to be higher on the center axis side of the multiple tube 510 and lower on the outer peripheral surface side of the multiple tube 510 in the radial direction of the multiple tube 510. As described above, in the case where the length of the tube member 511 on the inner side is longer, even if the residual gas has a high flow velocity, the stay time of the residual gas in the inner tube member 511 and the contact time of the residual gas in contact with the inner tube member 511 may be longer than in the case where the length of the tube member 511 on the inner side is shorter. Longer stay time and contact time may suppress the residual gas from passing through the gap between the tube members 511 before tin is deposited from the residual gas, and may increase the adhered amount of tin on the tube members 511. Alternatively, the tube member on the inner side may be shorter. Further, the tube members 511c, 511d may have substantially the same length. Further, the tube members 511c, 511d may not be alternately arranged, and another tube member 511c may be arranged adjacent to the tube member 511c, or another tube member 511d may be arranged adjacent to the tube member 511d. Thus, tube members having the same length may be arranged adjacent to each other. Further, in the tube members 511c, 511d arranged alternately, the respective tube members 511c of the present embodiment have substantially the same length, and the respective tube members 511d of the present embodiment have substantially the same length, but it is not limited thereto. For example, the tube members 511 and the tube members 511 longer than the tube members 511 are alternately arranged, where the lengths of the short tube members 511 may be different from each other and the lengths of the long tube members 511 may be different from each other. That is, the tube members 511c may have different lengths, and the tube members 511d may have different lengths.

6. DESCRIPTION OF TIN TRAP DEVICE OF THIRD EMBODIMENT

Next, the configuration of the tin trap device 400 according to a third embodiment will be described. Any component same as that described above is denoted by an identical reference sign, and duplicate description thereof is omitted unless specific description is needed.

6.1 Configuration

Figure 11:
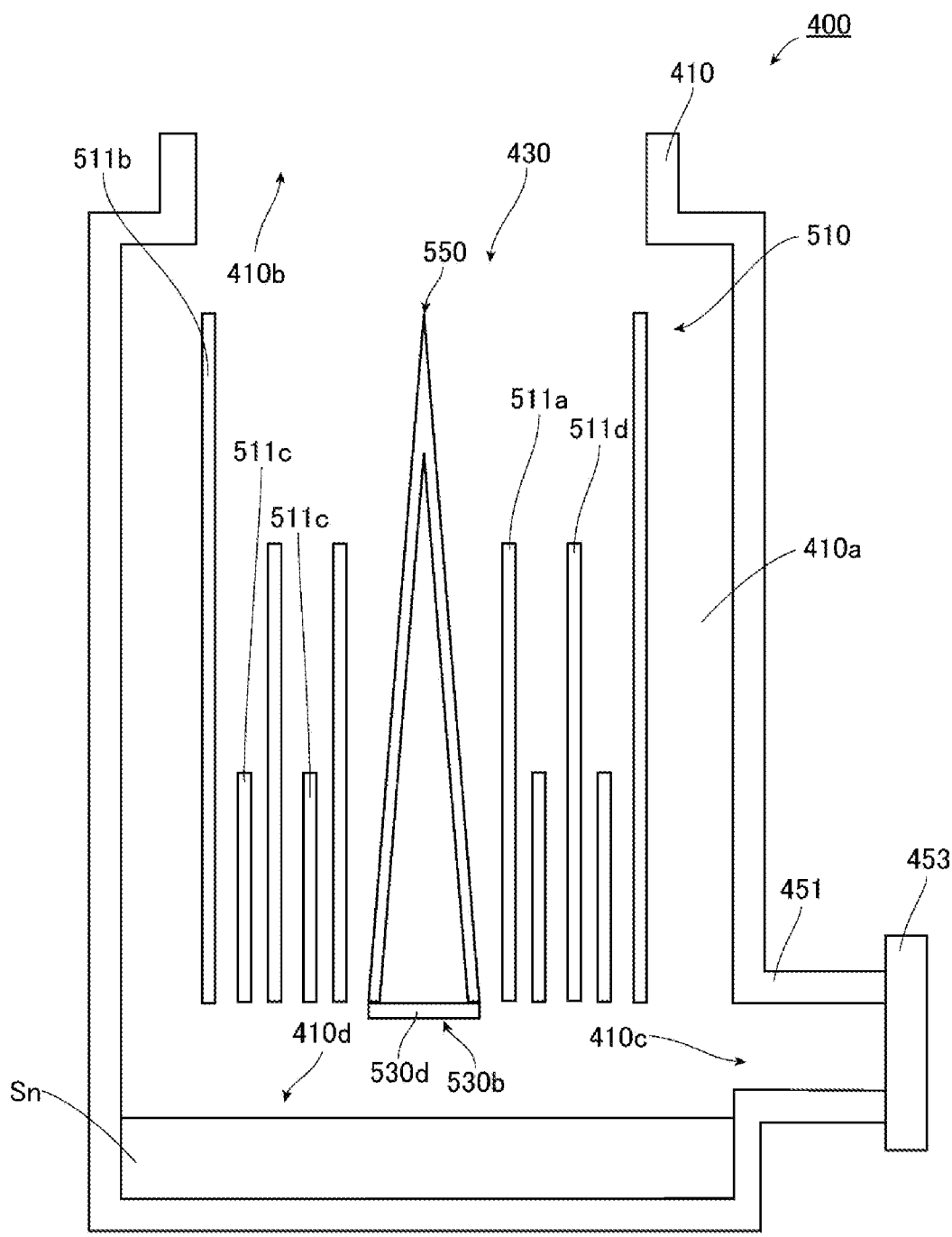
FIG. 11 is a schematic diagram showing a schematic configuration example of a part including the tin trap device according to a third embodiment.

FIG. 11 is a schematic view showing a schematic configuration example of a part including the tin trap device 400 according to the present embodiment. As shown in FIG. 11, in the trap main body 430 of the tin trap device 400 of the present embodiment, the configuration of the gas travel direction changing member 550 is different from that of the gas travel direction changing member 550 of the second embodiment. In FIG. 11, illustration of portions of the fixing member 530b other than the intersecting portion 530d is omitted.

The gas travel direction changing member 550 of the present embodiment may have a conical shape and be arranged such that the apex of the gas travel direction changing member 550 directs to the gas inlet port 410b. The periphery of the bottom surface of the cone is fixed to the intersecting portion 530d of the fixing member 530b. The gas travel direction changing member 550 preferably has a circular cone shape. The tube member 511*a* in the present embodiment is the tube member 511*d* located at the innermost position in the second embodiment, and the gas travel direction changing member 550 is arranged inside the tube member 511*a*. The gas travel direction changing member 550 of the present embodiment changes the travel direction of the fastest residual gas from the vertical direction to a direction inclined with respect to the vertical direction, and a part of the fastest residual gas flows along the circumferential surface of the gas travel direction changing member 550 and flows between the gas travel direction changing member 550 and the tube member 511*a*. The remaining part of the fastest residual gas flows through the gap between the tube members 511.

6.2 Effect

Since the gas travel direction changing member 550 has a conical shape, resistance to the fastest residual gas is reduced as compared with the case where the gas travel direction changing member 550 is arranged substantially perpendicular to the travel direction of the residual gas. Therefore, as compared with the case where the gas travel direction changing member 550 is arranged substantially perpendicular to the travel direction of the residual gas, the fastest residual gas easily flows, and the temperature of the multiple tube 510 can be lowered. As a result, tin contained in the fastest residual gas can easily adhere to the gas travel direction changing member 550 and the tube member 511*a*. The gas travel direction changing member 550 of the present embodiment may be arranged inside the multiple tube 510 instead of the gas travel direction changing member 550 of the first embodiment and the modifications thereof.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A tin trap device comprising:
   a housing including a gas inlet port into which gas containing tin flows from a chamber device, an internal space which communicates with the gas inlet port, and a gas exhaust port which exhausts the gas while communicating with the internal space;
   a multiple tube including a plurality of tube members, arranged on a flow path of the gas traveling to the gas exhaust port from the gas inlet port through the internal space, and having a temperature at which the tin deposited from the gas adheres to the tube member; and
   a gas travel direction changing member configured to change a travel direction of at least fastest gas of the gas traveling from the gas inlet port to the multiple tube.

2. The tin trap device according to claim 1,
   wherein the gas travel direction changing member changes the travel direction of the fastest gas so that the fastest gas flows through a portion other than an opening of the tube member from the opening into which the fastest gas is to flow when the gas travel direction changing member is not arranged.

3. The tin trap device according to claim 2,
   wherein the tube members are concentrically arranged, and
   the gas travel direction changing member changes the travel direction of the fastest gas so that the fastest gas flows into a gap of the multiple tube located outside the tube member located on an innermost side of the multiple tube.

4. The tin tap device according to claim 3,
   wherein the gas travel direction changing member closes the opening.

5. The tin trap device according to claim 4,
   wherein the gas travel direction changing member has a flat plate shape, and a main surface of the gas travel direction changing member is perpendicular to the travel direction of the fastest gas.

6. The tin trap device according to claim 1, comprising a fixing member which fixes a relative position of one end of each of the tube members facing the gas inlet port,
   wherein the gas travel direction changing member is part of the fixing member.

7. The tin trap device according to claim 1,
   wherein the temperature is 20° C. or higher and 70° C. or lower.

8. The tin trap device according to claim 1,
   wherein the tube members are arranged such that arrangement densities of the tube members in the multiple tube are lower on an upstream side than on a downstream side in the flow path of the gas.

9. The tin trap device according to claim 8,
   wherein the adjacent tube members have different lengths from each other, and
   the other end of each of the tube members on the opposite side to the one end of each of the tube members facing the gas inlet port is located at the same position in a center axis direction of the tube members.

10. The tin trap device according to claim 9,
    wherein the tube members are concentrically arranged, and
    in the multiple tube, the tube member located on an innermost side and the tube member located on an outermost side are longer than the tube member located at a gap between the tube member located on the innermost side and the tube member located on the outermost side.

11. The tin trap device according to claim 10,
    wherein a plurality of the tube members are arranged at the gap, and
    the tube members arranged in the gap have different lengths from each other.

12. The tin trap device according to claim 11,
    wherein the tube members having different lengths are alternately arranged.

13. The tin trap device according to claim 1,
wherein the gas travel direction changing member has a conical shape and is arranged such that an apex of the gas travel direction changing member directs to the gas inlet port.

14. The tin trap device according to claim 13,
wherein the tube members are concentrically arranged, and
the gas travel direction changing member is arranged inside the tube member located on the innermost side of the multiple tube.

15. The tin trap device according to claim 1,
wherein the gas inlet port is detachably attachable to an exhaust pipe of the chamber device and the gas exhaust port is detachably attachable to an exhaust pipe of an exhaust pump.

16. An extreme ultraviolet light generation apparatus, comprising:
- a chamber device configured to generate plasma by irradiation of a target substance including tin with laser light; and
- a tin trap device configured to collect the tin in the chamber device,
the tin trap device including:
- a housing including a gas inlet port into which gas containing tin flows from a chamber device, an internal space which communicates with the gas inlet port, and a gas exhaust port which exhausts the gas while communicating with the internal space;
- a multiple tube including a plurality of tube members, arranged on a flow path of the gas traveling to the gas exhaust port through the internal space from the gas inlet port, and having a temperature at which the tin deposited from the gas is to adhere to the tube member; and
- a gas travel direction changing member configured to change a travel direction of at least fastest gas of the gas traveling from the gas inlet port to the multiple tube.

17. An electronic device manufacturing method, comprising:
generating plasma by irradiating a target substance with laser light using an extreme ultraviolet light generation apparatus;
emitting the extreme ultraviolet light generated from the plasma to an exposure apparatus; and
exposing a photosensitive substrate to the extreme ultraviolet light in the exposure apparatus to manufacture an electronic device,
the extreme ultraviolet light generation apparatus including:
- a chamber device configured to generate the plasma by irradiation of the target substance including tin with the laser light; and
- a tin trap device configured to collect the tin in the chamber device,
the tin trap device including:
- a housing including a gas inlet port into which gas containing the tin flows from the chamber device, an internal space which communicates with the gas inlet port, and a gas exhaust port which exhausts the gas while communicating with the internal space;
- a multiple tube including a plurality of tube members, arranged on a flow path of the gas traveling to the gas exhaust port through the internal space from the gas inlet port, and having a temperature at which the tin deposited from the gas is to adhere to the tube member; and
- a gas travel direction changing member configured to change a travel direction of at least fastest gas of the gas traveling from the gas inlet port to the multiple tube.

18. An electronic device manufacturing method, comprising:
generating plasma by irradiating a target substance with laser light using an extreme ultraviolet light generation apparatus;
inspecting a defect of a mask by irradiating the mask with extreme ultraviolet light generated from the plasma;
selecting a mask using a result of the inspection; and
exposing and transferring a pattern formed on the selected mask onto a photosensitive substrate,
the extreme ultraviolet light generation apparatus including:
- a chamber device configured to generate the plasma by irradiation of the target substance including tin with the laser light; and
- a tin trap device configured to collect the tin in the chamber device,
the tin trap device including:
- a housing including a gas inlet port into which gas containing tin flows from a chamber device, an internal space which communicates with the gas inlet port, and a gas exhaust port which exhausts the gas while communicating with the internal space;
- a multiple tube including a plurality of tube members, arranged on a flow path of the gas traveling to the gas exhaust port through the internal space from the gas inlet port, and having a temperature at which the tin deposited from the gas is to adhere to the tube member; and
- a gas travel direction changing member configured to change a travel direction of at least fastest gas of the gas traveling from the gas inlet port to the multiple tube.

* * * * *